(12) United States Patent
Masai et al.

(10) Patent No.: US 7,973,630 B2
(45) Date of Patent: Jul. 5, 2011

(54) THIN FILM MAGNETIC DEVICE AND METHOD OF MANUFACTURING THE SAME

(75) Inventors: Taku Masai, Tokyo (JP); Ryuji Hashimoto, Tokyo (JP)

(73) Assignee: TDK Corporation, Tokyo (JP)

( * ) Notice: Subject to any disclaimer, the term of this patent is extended or adjusted under 35 U.S.C. 154(b) by 473 days.

(21) Appl. No.: 12/010,714

(22) Filed: Jan. 29, 2008

(65) Prior Publication Data

US 2009/0045899 A1 Feb. 19, 2009

(30) Foreign Application Priority Data

Jan. 31, 2007 (JP) .................................. 2007-022354

(51) Int. Cl.
*H01F 5/00* (2006.01)
*H01F 17/04* (2006.01)
*H01F 17/00* (2006.01)
*H01F 27/28* (2006.01)
*H01L 29/66* (2006.01)
*H01L 29/82* (2006.01)
*H01L 29/00* (2006.01)
*G05F 1/00* (2006.01)

(52) U.S. Cl. ........ 336/200; 336/172; 336/177; 336/232; 257/275; 257/421; 257/528; 323/282

(58) Field of Classification Search .................. 336/172, 336/177, 200, 232; 257/275, 421, 528; 323/282
See application file for complete search history.

(56) References Cited

U.S. PATENT DOCUMENTS

| | | | | |
|---|---|---|---|---|
| 5,548,265 A | * | 8/1996 | Saito | 336/200 |
| 5,793,272 A | * | 8/1998 | Burghartz et al. | 336/200 |
| 5,801,521 A | * | 9/1998 | Mizoguchi et al. | 323/282 |
| 2002/0048668 A1 | * | 4/2002 | Inoue | 428/210 |
| 2004/0111906 A1 | * | 6/2004 | Abe et al. | 33/355 R |

FOREIGN PATENT DOCUMENTS

| | | | | |
|---|---|---|---|---|
| JP | A 8-172015 | | | 7/1996 |
| JP | A 11-87125 | | | 3/1999 |
| JP | 2001143929 A | | * | 5/2001 |
| JP | A 2001-143929 | | | 5/2001 |

* cited by examiner

Primary Examiner — Elvin G Enad
Assistant Examiner — Tszfung Chan
(74) Attorney, Agent, or Firm — Oliff & Berridge, PLC

(57) ABSTRACT

A thin film magnetic device is provided, in which magnetic permeability in a high frequency range can be easily improved. Scratch-like grooves extending along an extending direction of a coil (for example, a Y-axis direction being an extending direction of a second coil part) are formed at least one side of a surface and a back of each of a lower magnetic film and an upper magnetic film. A magnetization direction of anisotropic magnetization is controlled in each of formation areas of the scratch-like grooves (formation areas of lower magnetic films and upper magnetic films), and therefore displacement (rotation) of the magnetization direction of the anisotropic magnetization is pinned by the scratch-like grooves. Consequently, certain magnetic permeability is kept even in a high frequency range. Moreover, such formation of the scratch-like grooves may not cause complexity in manufacturing process.

8 Claims, 23 Drawing Sheets
(1 of 23 Drawing Sheet(s) Filed in Color)

FIG. 18A
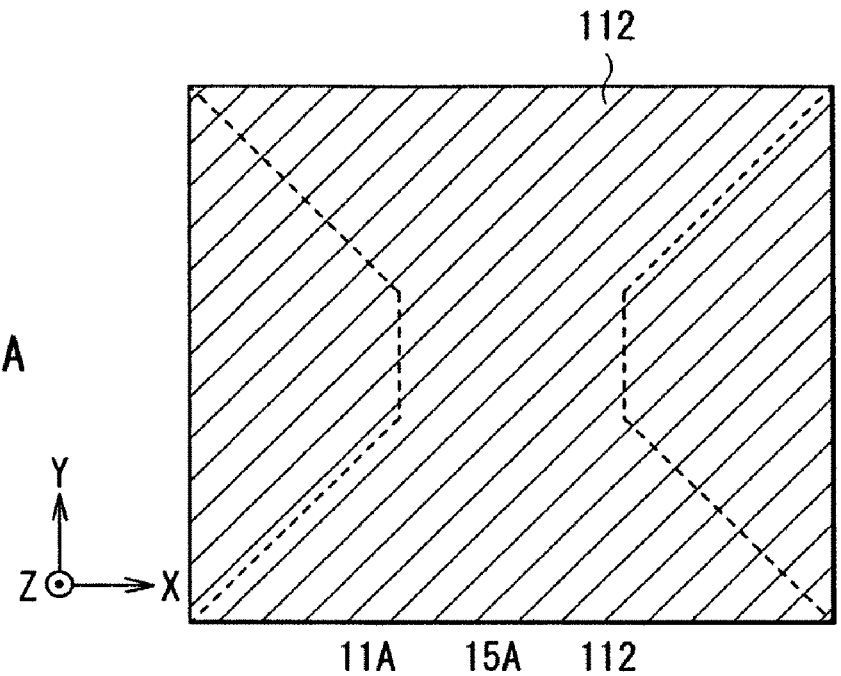
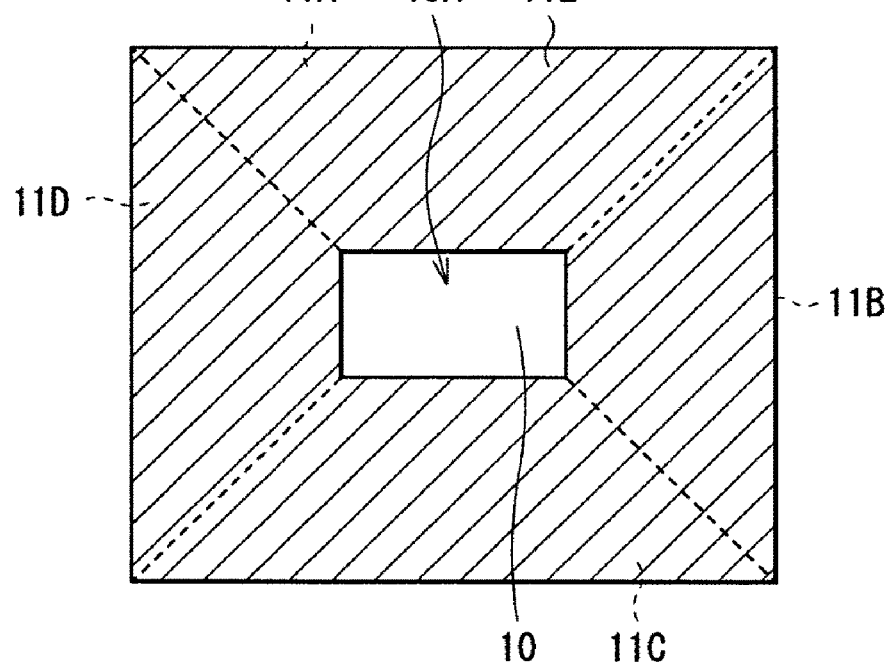
FIG. 18B

THIN FILM MAGNETIC DEVICE AND METHOD OF MANUFACTURING THE SAME

CROSS REFERENCES TO RELATED APPLICATIONS

The present invention contains subject matter related to Japanese Patent Application JP 2007-022354 filed in the Japanese Patent Office on Jan. 31, 2007, the entire contents of which being incorporated herein by reference.

BACKGROUND OF THE INVENTION

1. Field of the Invention

The present invention relates to a thin film magnetic device having a thin film coil and a magnetic film, and relates to a method of manufacturing the same.

2. Description of the Related Art

In the field of electronic devices for various use, a thin film magnetic device such as a thin film inductor or thin film transformer including a thin film coil and a magnetic film has been widely used so far as an integrated passive component.

FIGS. 30A and 30B show an example of a conventional thin film magnetic device (thin film inductor 101) in the related art formed by a rectangular spiral coil. FIG. 30A shows a configuration in plan view of the device, and FIG. 30B shows a configuration in cross section thereof taken along a line V-V of FIG. 30A. The thin film inductor 101 has a stack structure in which a lower magnetic film 104A having an opening 105A in its central portion, an insulating film 102, a rectangular spiral coil 103 having terminals 103T1 and 103T2, and an upper magnetic film 104B having an opening 105B in its central portion are stacked in this order on a substrate 100 in the Z axis direction. In the lower magnetic film 104A and the upper magnetic film 104B, a predetermined magnetic field is applied thereto in the X axis direction during film formation or the like, thereby a magnetization easy axis Me is formed in the application direction of the magnetic field (X axis direction), and a magnetization hard axis Mh is formed in a direction (Y axis direction) orthogonal to the magnetization easy axis, consequently the magnetic films have uniaxial anisotropy.

In recent years, such a thin film magnetic device is expected to be used in a high frequency band such as the GHz (gigahertz) band and the like. Accordingly, a magnetic film having excellent high frequency characteristics, specifically a magnetic film having high magnetic permeability in a high frequency range is desired.

For example, in a thin film magnetic device of the related art as shown in FIGS. 30A and 30B, since the thin film coil is a rectangular spiral coil, a coil part extending in the X axis direction and a coil part extending in the Y axis direction exist respectively, and consequently a coil portion extending along the magnetization easy axis Me and a coil portion extending along the magnetization hard axis Mh mixedly exist. Therefore, in a coil part in which the magnetization direction generated by the coil is orthogonal to the magnetization easy axis Me (X axis direction), while magnetic permeability is naturally low in a low frequency range, certain magnetic permeability can be kept in a high frequency range. On the other hand, in a coil part in which the magnetization direction is parallel to the magnetization easy axis Me (Y axis direction), while magnetic permeability is high in the low frequency range, the magnetic permeability is abruptly decreased in the high frequency range. Hence, use efficiency of magnetic characteristics of the magnetic film is low (in the case of a square spiral coil, about 50%), and consequently high magnetic permeability has been hardly exhibited in the high frequency range.

Thus, to improve the magnetic permeability in the high frequency range, thin film magnetic devices have been proposed as shown in Japanese Unexamined Patent Application Publication (JP-A) Nos. H8-172015, 2001-143929, and H11-87125. Among them, JP-A No. H8-172015 discloses a device in which a direction of the magnetization easy axis of a magnetic film is varied by using magnetic shape anisotropy of the magnetic film in correspondence to a coil part in each of two directions of a rectangular spiral coil. Specifically, a magnetic film is separately formed in a magnetic field in correspondence to the coil part in each of two directions, so that both of the coil parts in two directions are orthogonal to the magnetization easy axis to improve magnetic permeability in the high frequency range.

JP-A No. 2001-143929 discloses a device in which the magnetization easy axis direction of a magnetic film is rotated by forming fine slits circulating in correspondence to coil parts of a rectangular spiral coil. The device is designed to improve magnetic permeability in a high frequency range by making both of the coil parts in two directions to be orthogonal to the magnetization easy axis as in the JP-A No. H8-172015.

SUMMARY OF THE INVENTION

However, in the thin film magnetic devices shown in JP-A Nos. H8-172015 and 2001-143929, the number of deposition times of magnetic thin films is increased in correspondence to coil patterns, or a fine slit needs to be formed in correspondence to a coil pattern, resulting in a complexity in manufacturing process.

In view of such drawbacks, it is desirable to provide a thin film magnetic device in which magnetic permeability in a high frequency range can be easily improved, and a method of a manufacturing the thin film magnetic device.

A thin film magnetic device of an embodiment of the invention includes a thin film coil extending along a plane, and one or more magnetic films disposed above and below or both of them of the thin film coil, and having anisotropic magnetization along a layer plane of the magnetic film, where scratch-like grooves extending along an extending direction of the thin film coil are formed on a surface or a back or both of them of the magnetic film. Here, the "scratch-like grooves" mean intentionally formed scratch-like grooves.

In the thin film magnetic device of an embodiment of the invention, since the scratch-like grooves extending along the extending direction of the thin film coil are formed at least one side of the surface and the back of the magnetic film, a magnetization direction of the anisotropic magnetization of the magnetic film is controlled in a formation area of the scratch-like grooves. That is, even if a magnetic field is applied in a direction orthogonal to the extending direction of the coil in the plane of the magnetic film, since displacement (rotation) of the magnetization direction of the anisotropic magnetization is pinned by the scratch-like grooves, the magnetization direction of the anisotropic magnetization is not displaced to an application direction of the magnetic field. Consequently, certain magnetic permeability is kept even in a high frequency range. Moreover, such formation of the scratch-like grooves may not cause complexity in manufacturing process.

In the thin film magnetic device of an embodiment of the invention, an extending area of the thin film coil is divided into four divided areas along a winding direction of the thin film coil, the four divided areas including a first pair of divided areas located along a crisscross line direction, the scratch-like grooves being not formed on the magnetic films in the first pair of divided areas, and a second pair of divided areas located along another crisscross line direction, the scratch-like grooves being formed on the magnetic films in the second pair of divided areas. In the case of such a configuration, the magnetic films in the second pair of divided areas are controlled in magnetization direction of the anisotropic magnetization, consequently certain magnetic permeability is kept in a high frequency range. The scratch-like grooves may be formed on the magnetic films in the four divided areas respectively. The crisscross line direction and the another crisscross line direction are not always orthogonal to each other.

The thin film magnetic device of an embodiment of the invention can be configured such that a direction of the anisotropic magnetization of the magnetic films in the first pair of divided areas is orthogonal to an extending direction of the scratch-like grooves on the magnetic film in the second pair of divided areas, and furthermore can be configured such that a direction of the anisotropic magnetization and the extending direction of the scratch-like grooves form an acute angle with respect to each other in the magnetic films in the second pair of divided areas.

The thin film magnetic device of an embodiment of the invention may be designed such that nonmagnetic films are formed at underside of the magnetic films only in the first pair of divided areas, or may be designed such that dummy layers having scratch-like grooves formed thereon, and formed under the magnetic films only in the second pair of divided areas, the scratch-like trench corresponding to the scratch-like grooves on the magnetic films in the second pair of divided areas.

In the thin film magnetic device of an embodiment of the invention, the scratch-like grooves are preferably formed in a discontinuous manner. In the case of such a configuration, decrease in volume of the magnetic film can be reduced compared with a case that the scratch-like grooves are formed in a continuous manner. In other word, since volume of a magnetic film is increased compared with the case that the grooves are formed in a continuous manner, magnetic characteristics of the thin film magnetic device are relatively improved (for example, in the case of the thin film inductor, inductance is relatively increased). In this case, it is more preferable that the scratch-like grooves are intermittently formed in lines along the extending direction of the thin film coil, and adjacent lines are arranged in a staggered manner with respect to each other. In the case of such a configuration, decrease in volume of the magnetic film is further reduced, leading to further improvement in magnetic characteristics of the thin film magnetic device.

In the thin film magnetic device of an embodiment of the invention, in the magnetic film, a ratio of surface roughness of a surface with the scratch-like grooves of the magnetic film, to thickness of the magnetic film is preferably 0.02 or more, and more preferably 0.04 or more. In the case of such a configuration, a magnetization direction of anisotropic magnetization of the magnetic film is easily controlled in a formation area of the scratch-like grooves.

A method of manufacturing a thin film magnetic device of an embodiment of the invention includes a first step of forming a thin film coil on a substrate, a second step of forming a magnetic film above or below or both of them of the thin film coil, the magnetic film having scratch-like grooves extending along an extending direction of the thin film coil on a surface or a back or both of them of the magnetic film, and a third step of performing heat treatment while applying a magnetic field in a predetermined direction along the magnetic film.

In the method of manufacturing a thin film magnetic device of an embodiment of the invention, since the magnetic film is formed at least one side of the surface and the back of the magnetic film, the magnetic film having the scratch-like grooves extending along the extending direction of the thin film coil, then heat treatment is performed while applying the magnetic field in the predetermined direction in the plane of the magnetic film, a magnetization direction of the anisotropic magnetization of the magnetic film is controlled in a formation area of the scratch-like grooves. That is, even if an application direction of a magnetic field is orthogonal to the extending direction of the coil, since displacement (rotation) of the magnetization direction of the anisotropic magnetization is pinned by the scratch-like grooves, the magnetization direction of the anisotropic magnetization is not displaced to an application direction of the magnetic field. Consequently, certain magnetic permeability is kept even in a high frequency range. Moreover, such formation of the scratch-like grooves may not cause complexity in manufacturing process.

In the method of manufacturing a thin film magnetic device of an embodiment of the invention, the second step may include a step of forming a magnetic film above or below or both of them of the thin film coil, and a step of forming the scratch-like grooves on a surface of the magnetic film. In the case of such a configuration, the scratch-like grooves are directly formed on the surface of the magnetic film. In this case, the scratch-like grooves may be formed by polishing the surface of the magnetic film.

In the method of manufacturing a thin film magnetic device of an embodiment of the invention, the second step may include a step of forming scratch-like grooves on a surface of the substrate or of an upper layer formed on or above the substrate, the scratch-like grooves extending along the extending direction of the thin film coil, and a step of forming the magnetic film on the surface with the scratch-like grooves above or below or both of them of the thin film coil. In the case of such a configuration, scratch-like slits corresponding to a formation pattern of the above scratch-like grooves are indirectly formed even at a back side of the magnetic film. In this case, the scratch-like slits may be formed by polishing the surface or the layer thereon of the substrate. Moreover, the step of forming the scratch-like grooves may include a step of forming a resin film on the surface of the substrate or of the upper layer, and a step of forming scratch-like slits on a surface of the resin film by pressing a nano stamper to the surface of the resin film, the nano stamper having a surface with scratch-like grooves corresponding to the scratch-like grooves to be formed on the magnetic films.

Preferably, the method of manufacturing a thin film magnetic device of an embodiment of the invention, further includes a step of performing heat treatment while applying a magnetic field in a direction orthogonal to the application direction of the magnetic field in the third step along the magnetic film, implemented between the step of forming the magnetic film and the third step. In this case, the step of applying the magnetic field along a direction orthogonal to the application direction of the magnetic field in the third step is preferably performed after formation of the scratch-like grooves on the magnetic film, or may be performed before formation of the scratch like grooves. Moreover, preferably, in the step of forming the magnetic film, the magnetic film is formed while applying a magnetic field in a direction orthogonal to the application direction of the magnetic field in the third step along the magnetic film. In the case of such configuration, since a magnetization direction of anisotropic magnetization is previously oriented in a direction orthogonal to the application direction of the magnetic field in the third step, pinning operation against displacement of the anisotropic magnetization is relatively enhanced, and thus magnetic permeability in a high frequency range is also relatively improved.

According to the thin film magnetic device of an embodiment of the invention, since the scratch-like grooves extending along the extending direction of the thin film coil are formed in at least one of sides of the surface and the back of the magnetic film, the magnetization direction of the anisotropic magnetization of the magnetic film can be controlled in the formation area of the scratch-like grooves, consequently displacement (rotation) of the magnetization direction of the anisotropic magnetization can be pinned by the scratch-like grooves. Therefore, certain magnetic permeability can be kept even in a high frequency range. Moreover, such formation of the scratch-like grooves may not cause complexity in manufacturing process. Accordingly, magnetic permeability in a high frequency range can be easily improved.

According to the method of manufacturing the thin film magnetic device of an embodiment of the invention, since the magnetic film is formed in at least one of sides of the surface and the back of the magnetic film, the magnetic film having the scratch-like grooves extending along the extending direction of the thin film coil, then heat treatment is performed while applying the magnetic field in a predetermined direction in the plane of the magnetic film, the magnetization direction of the anisotropic magnetization of the magnetic film can be controlled in the formation area of the scratch-like grooves, consequently displacement (rotation) of the magnetization direction of the anisotropic magnetization can be pinned by the scratch-like grooves. Moreover, such formation of the scratch-like grooves may not cause complexity in manufacturing process. Accordingly, magnetic permeability in a high frequency range can be easily improved.

BRIEF DESCRIPTION OF THE DRAWINGS

The patent or application file contains at least one drawing executed in color. Copies of this patent of patent application publication with color drawing(s) will be provided by the Office upon request and payment of the necessary fee.

FIGS. 18A to 18B are plan diagrams for illustrating the method of manufacturing the sectional configuration following FIGS. 17A to 17C respectively;

DETAILED DESCRIPTION OF THE PREFERRED EMBODIMENTS

Best modes for carrying out the invention (hereinafter, simply called embodiments) will be described in detail hereinafter with reference to drawings.

First Embodiment

Figure 1:
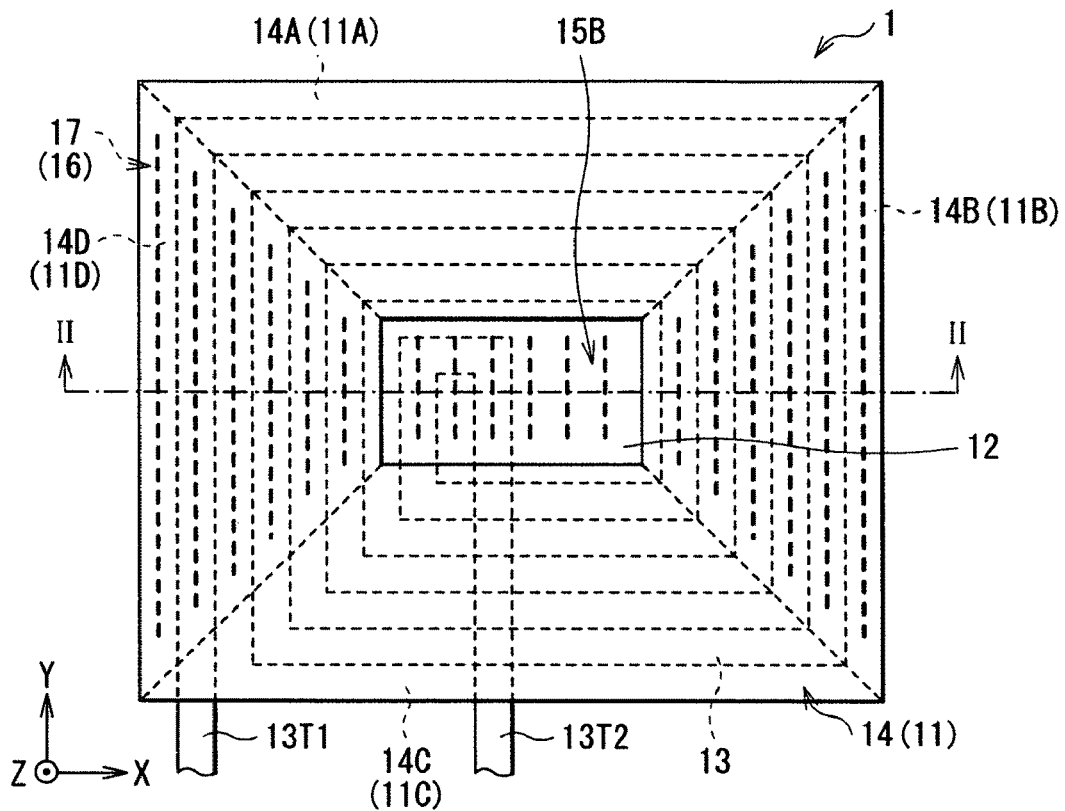
FIG. 1 is a plan diagram showing a configuration of a thin film magnetic device according to a first embodiment of the invention.
Figure 2:
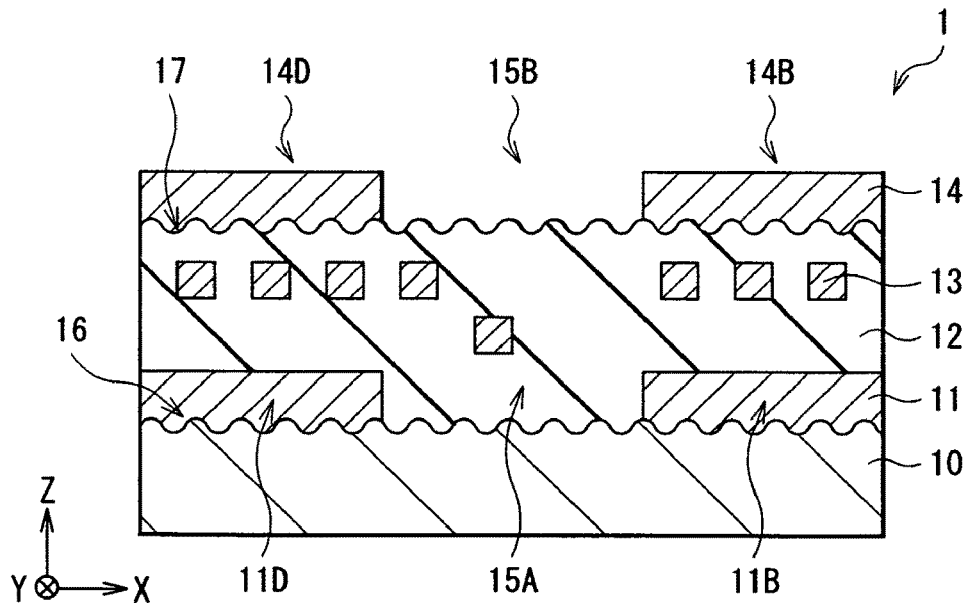
FIG. 2 is a cross section diagram showing the configuration of the thin film magnetic device taken along a line II-II of FIG. 1.

FIGS. 1 and 2 show a configuration of a thin film inductor 1 as a thin film magnetic device according to a first embodiment of the invention. FIG. 1 shows a configuration in an X-Y plane, and FIG. 2 shows a configuration in a section X-Z taken along a line II-II in FIG. 1. The thin film inductor 1 has a stack structure in which a lower magnetic film 11, an insulating film 12, a thin film coil 13, and an upper magnetic film 14 are stacked in this order on a substrate 10.

The substrate 10 is a rectangular substrate supporting the whole thin film inductor 1, and is made of glass, silicon (Si), aluminum oxide ($Al_2O_3$, so-called "alumina"), ceramics, semiconductor, resin or the like. However, a material of the substrate is not limited to the series of materials, but may be freely selected. scratch-like grooves 16 extending along an extending direction of the coil 13 described later are formed on part of a surface of the substrate 10 (portions corresponding to extending areas of lower magnetic films 11B and 11D described later).

The insulating film 12 electrically isolates the coil 13 from the periphery, and is made of an insulating material such as silicon oxide ($SiO_2$). Scratch-like grooves 17 extending along an extending direction of the coil 13 described later are formed even on part of a surface of the insulating film 12 (portions corresponding to extending areas of upper magnetic films 14B and 14D described later).

The coil 13 is provided to form an inductor between its one end (13T1) and the other end (13T2), and is made of a conductive material such as copper (Cu). The coil 13 has a rectangular spiral structure wound such that both of the end portions 13T1 and 13T2 are led to the outside in the X-Y plane. The coil 13 has a coil part extending in the X axis direction (first coil part) and a coil part extending in the Y axis direction (second coil part). Thus, an extending area of the coil 13 is configured by four divided areas including a pair of divided areas opposed to each other, in which a first coil part extends, (first pair of divided areas), and a pair of divided areas opposed to each other, in which a second coil part extends, (second pair of divided areas). A portion leading to the end 13T2 in the coil 13 is disposed below a winding portion including a portion leading to the end 13T1 of the coil 13 so as to be led to the outside without being contacted to the winding portion.

The lower magnetic film 11 and the upper magnetic film 14 are provided to increase inductance of the thin film inductor 1, and have rectangular openings 15A and 15B in central portions thereof respectively. The lower magnetic film 11 is formed under the insulating film 12, namely, between the substrate 10 and the insulating film 12, and the upper magnetic film 14 is formed over the insulating film 12. The lower magnetic film 11 and the upper magnetic film 14 are made of a magnetic material such as cobalt (Co) alloy, iron (Fe) alloy, or nickel alloy (Ni—Fe, so-called permalloy) respectively. Preferable examples of the cobalt alloy are cobalt zirconium tantalum (CoZrTa) alloy and cobalt zirconium niobium (CoZrNb) alloy from the viewpoint of practical use of the thin film inductor 1. The shape of each of the openings 15A and 15B is not limited to a rectangular shape but may be any shape.

The lower magnetic film 11 and the upper magnetic film 14 include four lower magnetic films 11A to 11D and four upper magnetic films 14A to 14D, the films being provided in correspondence to four divided areas formed by dividing the extending area of the coil 13 along a winding direction of the coil, respectively. While described in detail later, the lower magnetic films 11A to 11D and the upper magnetic films 14A to 14D have anisotropic magnetization (anisotropic magnetization Ma to Md described later) in a plane (X-Y plane) of respective films. Since the scratch-like grooves 16 are formed on the substrate 10, scratch-like grooves having a shape indirectly corresponding to a formation pattern of the scratch-like grooves 16 are formed on respective backs of the lower magnetic films 11B and 11D of the lower magnetic films 11A to 11D. Similarly, since the scratch-like grooves 17 are formed on the insulating film 12, scratch-like grooves having a shape indirectly corresponding to a formation pattern of the scratch-like grooves 17 are formed on respective backs of the upper magnetic films 14B and 14D of the upper magnetic films 14A to 14D.

Figure 3:
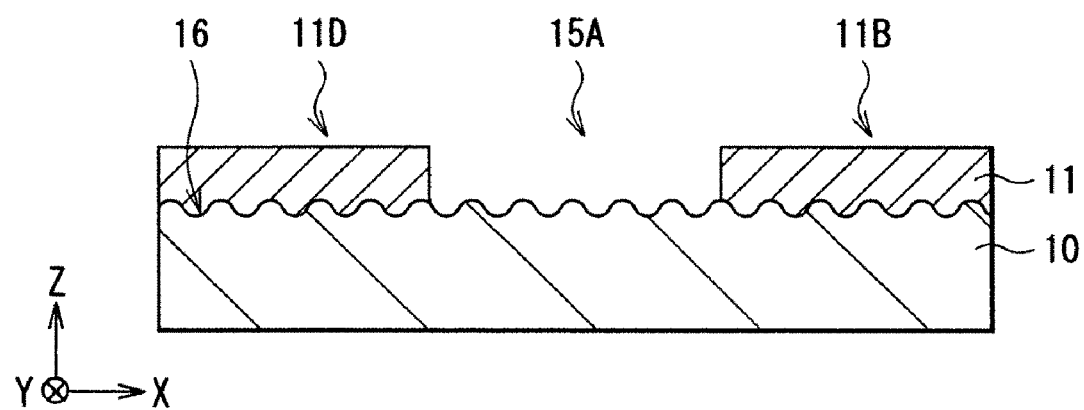
FIG. 3 is a cross section diagram for illustrating a method of manufacturing the thin film magnetic device shown in FIGS. 1 and 2.

Next, an example of a method of manufacturing the thin film inductor 1 of the embodiment is described with reference to FIGS. 3 to 10B. FIGS. 3 to 9 show an example of the method of manufacturing the thin film inductor 1. FIGS. 3 and 6 show a configuration in the X-Z section, and FIGS. 4, 5, and FIGS. 7A to 9 show a configuration in the X-Y plane, respectively. The configuration in the X-Y plane is shown in a simplified manner while the coil 13 is omitted to be shown.

First, as shown in FIG. 3, the lower magnetic film 11 is formed on the substrate 10 made of the above-described material, the lower magnetic film having the opening 15A and having the scratch-like grooves 16 at its back side.

Figure 4A:
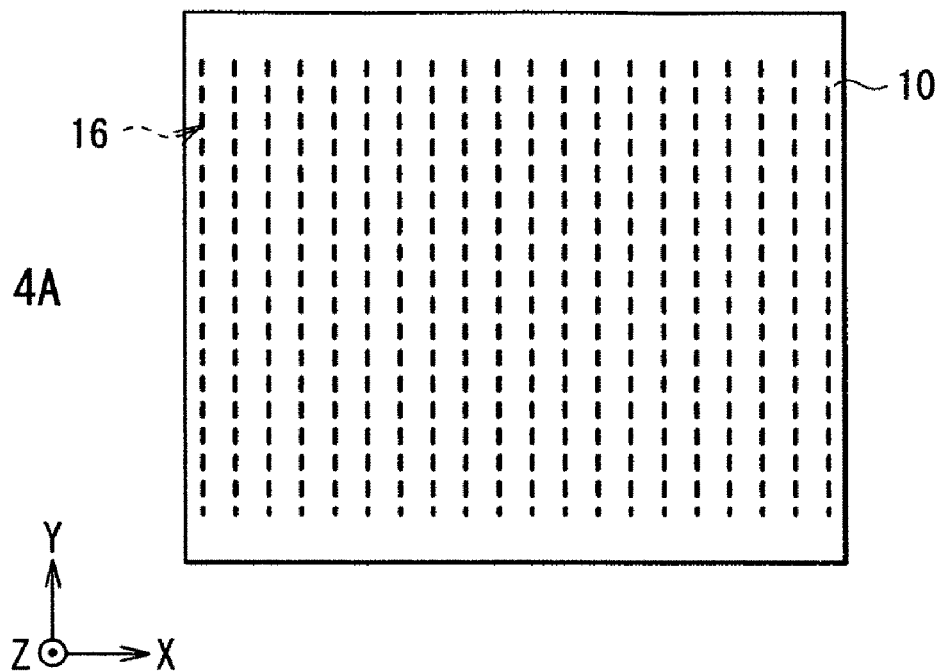
FIGS. 4A to 4B are plan diagrams for illustrating a method of manufacturing the sectional configuration as shown in FIG. 3 respectively.

Specifically, first, as shown in FIG. 4A, a surface of the substrate 10 is, for example, polished, thereby the scratch-like grooves 16 are uniformly formed on a surface of the substrate 10, the scratch-like grooves being to extend along an extending direction (Y-axis direction) of the second coil part of the coil 13. Width of a groove of the scratch-like grooves 16 is, for example, about 5 to 20 µm, and depth of a groove thereof is, for example, about 0.2 to 0.4 µm.

Figure 4B:
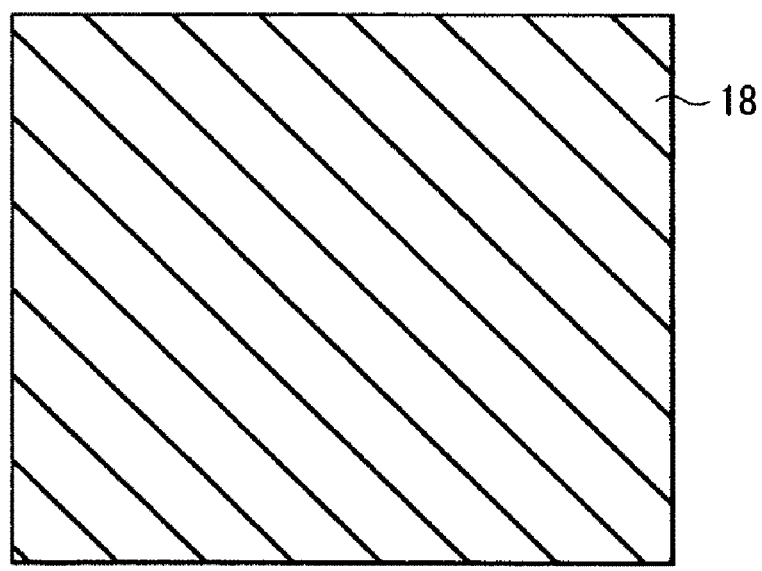

Next, as shown in FIG. 4B, a polyimide film 18 having a thickness of, for example, about 500 nm is uniformly formed on the substrate 10 having the scratch-like grooves 16 formed thereon. The polyimide film 18 corresponds to a specific example of the "nonmagnetic film" in the invention. Therefore, another nonmagnetic film may be formed in place of the polyimide film 18.

Figure 5A:
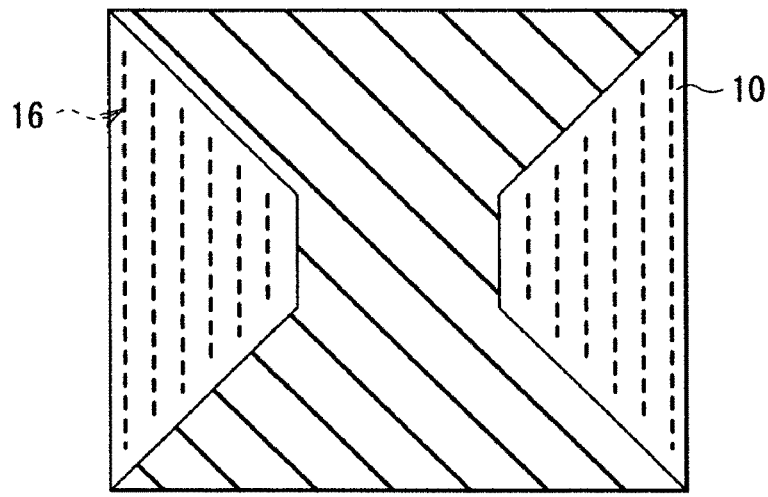
FIGS. 5A to 5C are plan diagrams following FIG. 4B for illustrating the method of manufacturing the sectional configuration respectively.
Figure 6:
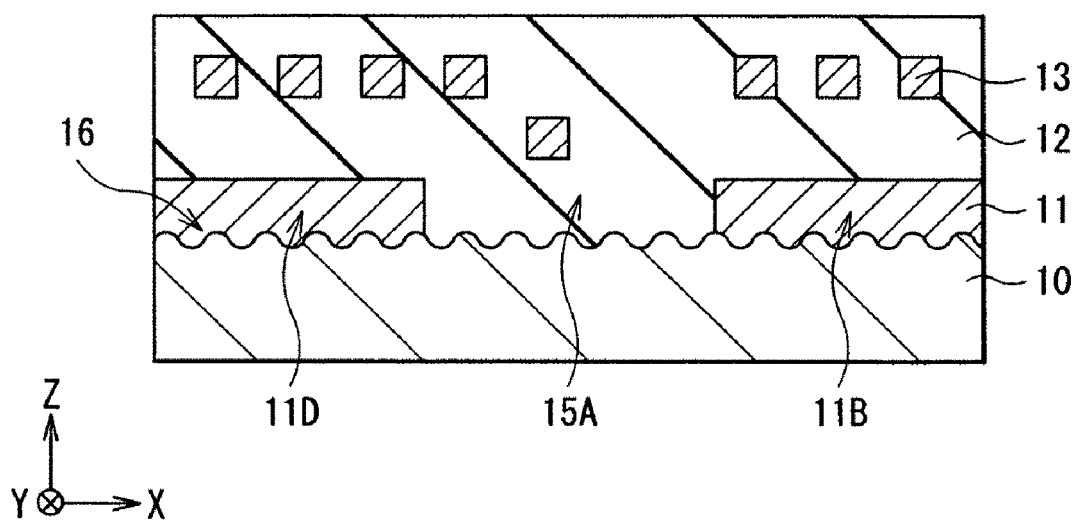
FIG. 6 is a cross section diagram for illustrating the method of manufacturing the thin film magnetic device following FIG. 3.

Next, as shown in FIG. 5A, the polyimide film 18 is patterned using photolithography or the like, and only the polyimide film 18 in a pair of divided areas (second pair of divided areas), in which the second coil parts is to extend, is selectively removed. Consequently, the substrate 10 having the scratch-like grooves 16 formed thereon is exposed only from the second pair of divided areas, and the polyimide film 18 being a nonmagnetic film is formed only at a back side of the lower magnetic film 11 (specifically, lower magnetic films 11A and 11C) in the first pair of divided areas.

Figure 5B:
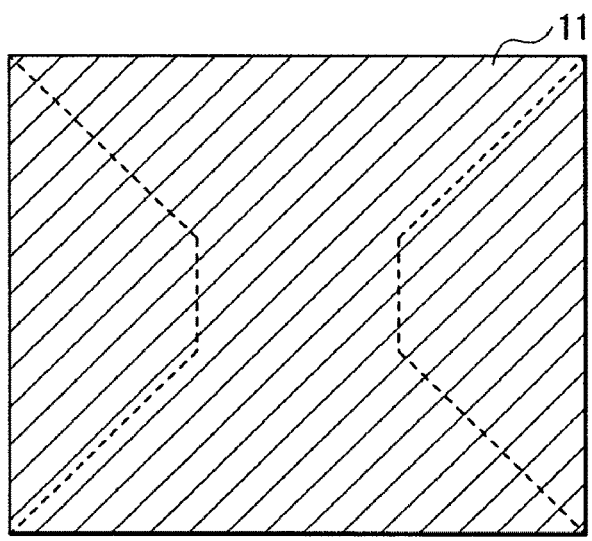
Figure 5C:
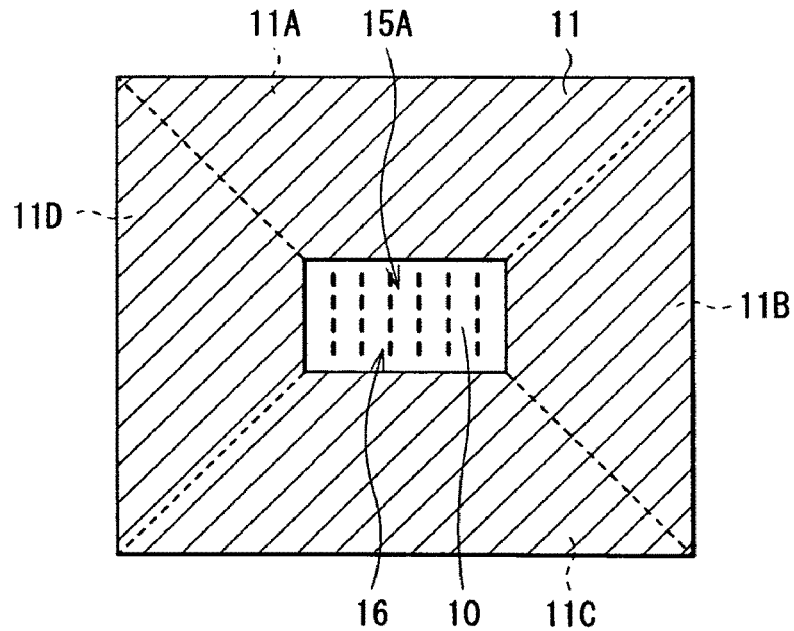

Next, as shown in FIG. 5B, the lower magnetic film 11 including the described material is uniformly formed on the substrate 10 and the polyimide film 18 by, for example, sputtering or plating. Thickness of the lower magnetic film 11 is set to be, for example, about 5 to 15 µm. Then, as shown in FIG. 5C, the lower magnetic film 11 is etched using a predetermined etching material to form the opening 15A. Thus, a section structure as shown in FIG. 3 is formed.

Next, as shown in FIG. 6, the insulating film 12 made of the above-described material and the coil 13 are formed on the substrate 10 and the lower magnetic film 11. The insulating film 12 is formed by, for example, sputtering. The coil 13 is formed by, for example, plating. Since the coil 13 is buried in the insulating film 12 as shown in FIG. 6, the coil 13 is formed while the insulating film 12 is dividedly formed as upper and lower portions.

Next, as in the steps described using FIGS. 3 to 5C, the upper magnetic film 14 is formed on the insulating film 12, the upper magnetic film having the opening 15B and the scratch-like grooves 17 at its back side as shown in FIGS. 1 and 2. Specifically, a surface of the insulating film 12 is, for example, polished, thereby the scratch-like grooves 17 are uniformly formed on a surface of the insulating film 12, the scratch-like grooves extending along the extending direction (Y-axis direction) of the second coil part of the coil 13. Again in the scratch-like grooves 17, width of a groove is, for example, about 5 to 20 μm, and depth of a groove is, for example, about 0.2 to 0.4 μm. Similarly as shown in FIGS. 4A to 4B and 5A to 5C, a polyimide film or the like being a nonmagnetic film (not shown) is formed on the insulating film 12, then only the polyimide film or the like in the pair of divided areas (second pair of divided areas), in which the second coil parts extend, is selectively removed. Consequently, the insulating film 12 having the scratch-like grooves 17 formed thereon is exposed only from the second pair of divided areas, and the polyimide film being the nonmagnetic film or the like is formed only at a back side of the upper magnetic film 14 (specifically, upper magnetic films 14A and 14C) in the first pair of divided areas.

Figure 7A:
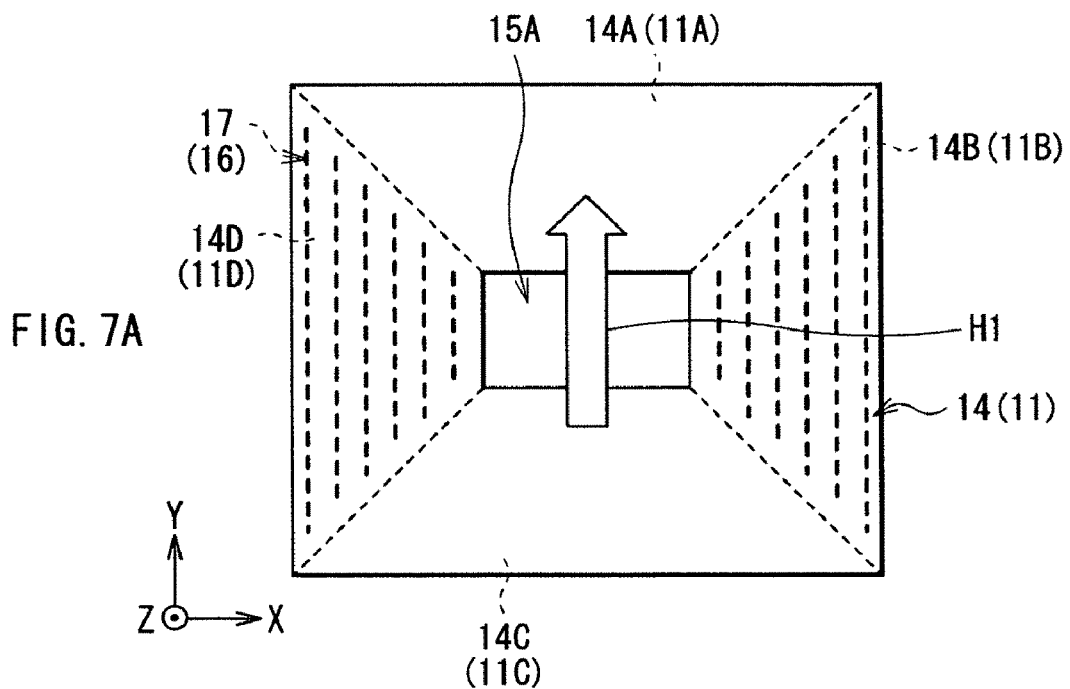
FIGS. 7A to 7B are plan diagrams following FIG. 6 for illustrating the method of manufacturing the thin film magnetic device respectively.
Figure 7B:
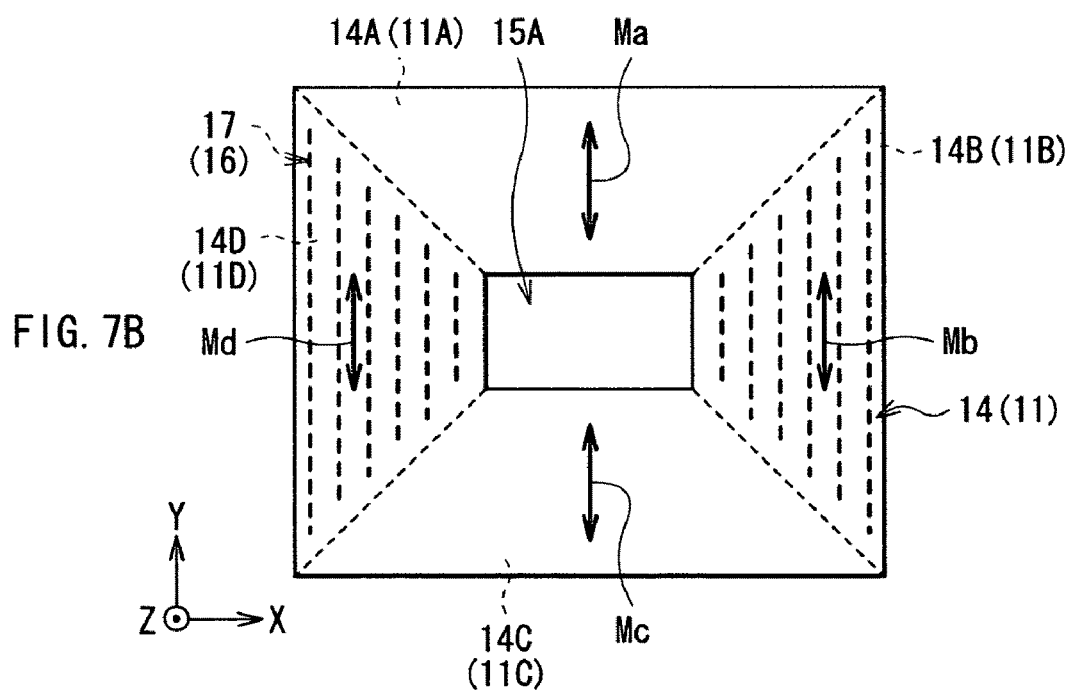

Next, as shown in FIG. 7A, heat treatment is performed while applying a fixed magnetic field H1 in the plane (X-Y plane) of the lower and upper magnetic films 11 and 14. An application direction of the fixed magnetic field H1 is set approximately parallel to an extending direction of the second coil part of the coil 13 and an extending direction of the scratch-like grooves 16 and 17, that is, the Y-axis direction in this case. For example, a level of the fixed magnetic field H1 is about $300*10^3/4\pi$ [A/m] (=300 Oe), heat treatment temperature is about 330° C., and heat treatment time is about one hour. Thus, as shown in FIG. 7B, the lower magnetic films 11A to 11D and the upper magnetic films 14A to 14D have magnetization directions of their anisotropic magnetization Ma to Md along the application direction of the fixed magnetic field H1 (Y-axis direction) respectively, and consequently the lower magnetic film 11 and the upper magnetic film 14 have uniaxial anisotropy (have magnetization easy axes) along the Y-axis direction respectively.

Figure 8:
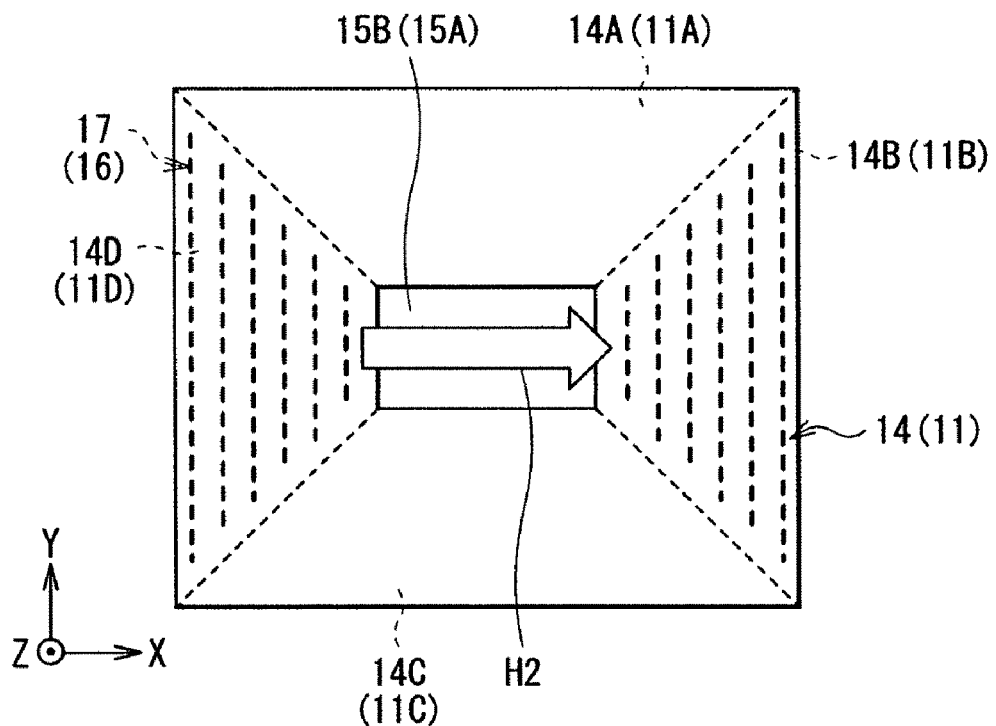
FIG. 8 is a plan diagram for illustrating the method of manufacturing the thin film magnetic device following FIGS. 7A to 7C.
Figure 9:
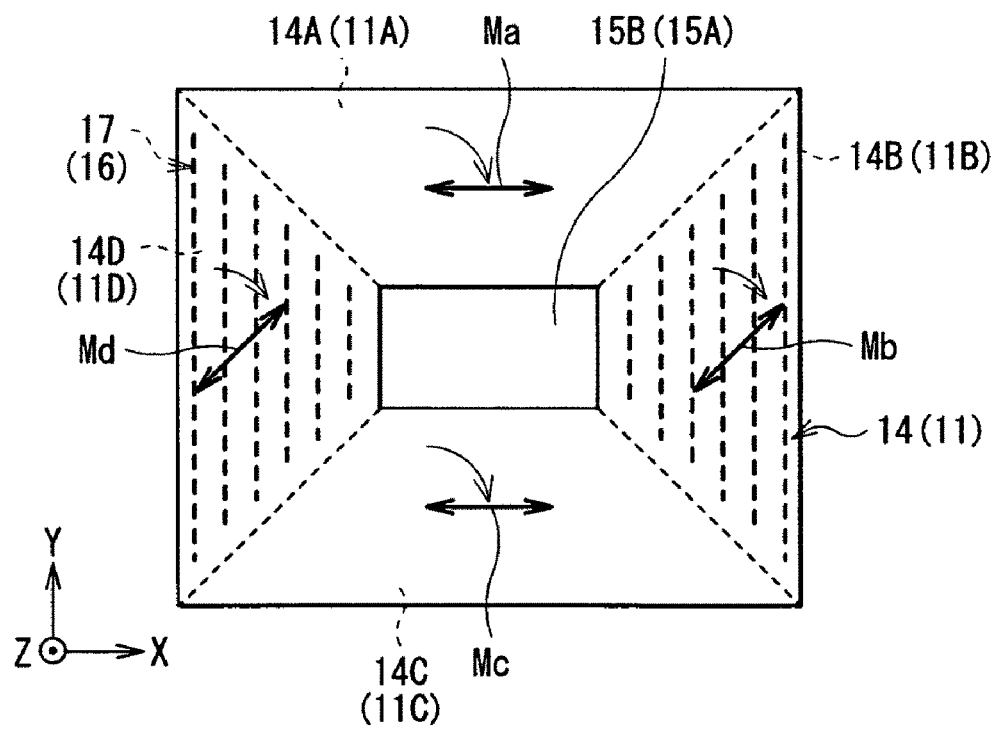
FIG. 9 is a plan diagram for illustrating the method of manufacturing the thin film magnetic device following FIG. 8.

Next, as shown in FIG. 8, heat treatment is performed while applying a fixed magnetic field H2 in the plane (X-Y plane) of the lower and upper magnetic films 11 and 14. An application direction of the fixed magnetic field H2 is set approximately parallel to an extending direction of the first coil part of the coil 13, and approximately orthogonal to an extending direction of the scratch-like grooves 16 and 17, that is, the X-axis direction being orthogonal to the application direction of the fixed magnetic field H1 (Y-axes direction). For example, a level of the fixed magnetic field H2 is about $300*10^3/4\pi$ [A/m] (=300 Oe), heat treatment temperature is about 330° C., and heat treatment time is about one hour. Thus, as shown in FIG. 9, in magnetic films in areas where the scratch-like grooves 16 and 17 are not formed (the lower magnetic films 11A and 11C and the upper magnetic films 14A and 14C), magnetization directions of anisotropic magnetization Ma and Md are displaced (rotated) to the application direction of the fixed magnetic field H2 (X-axis direction) respectively. On the other hand, in magnetic films in areas where the scratch-like grooves 16 and 17 are formed (the lower magnetic films 11B and 11D and the upper magnetic films 14B and 14D), the magnetization directions of the anisotropic magnetization Ma and Md are controlled. That is, displacement (rotation) of the respective magnetization directions of the anisotropic magnetization Ma and Md is pinned by the scratch-like grooves 16 and 17, thereby each of the magnetization directions of the anisotropic magnetization Ma and Md is prevented from being displaced (rotated) to the application direction of the fixed magnetic field H2 (X-axis direction).

Figure 10A:
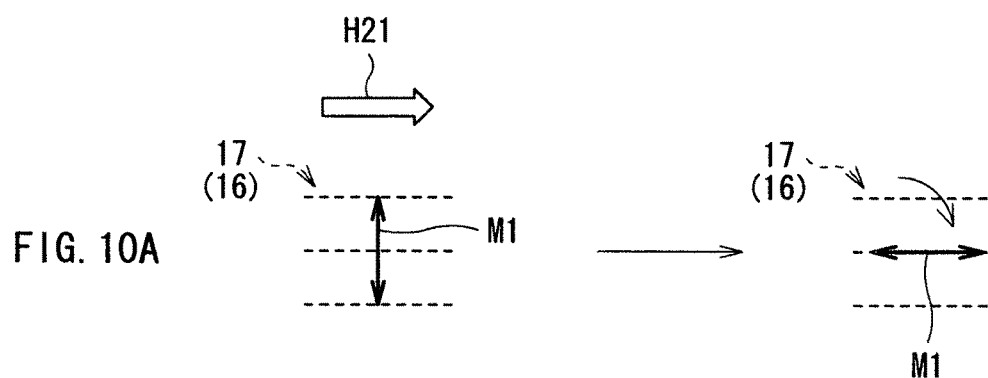
FIGS. 10A to 10B are schematic plan diagrams for illustrating a relationship between an anisotropic magnetization direction and an extending direction of scratch-like grooves in a divided area respectively.
Figure 10B:
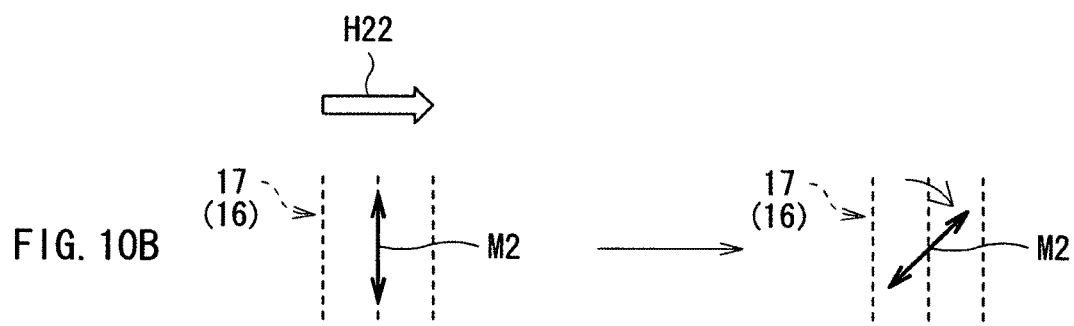

Specifically, for example, as shown in FIG. 10A, in the case that the extending direction of the scratch-like grooves 16 or 17 is approximately orthogonal to a magnetization direction of the anisotropic magnetization M1 in the plane of the magnetic film, or in the case that the scratch-like grooves 16 or 17 themselves are not formed (the case of the lower magnetic films 11A and 11C, and the case of the upper magnetic films 14A and 14C), when a fixed magnetic field H21 is applied in a direction orthogonal to the magnetization direction of the anisotropic magnetization M1 in the plane of the magnetic films, the magnetization direction of the anisotropic magnetization M1 is displaced (rotated) to an application direction of the fixed magnetic field H21. On the other hand, for example, as shown in FIG. 10B, in the case that the extending direction of the scratch-like grooves 16 or 17 is approximately parallel to the magnetization direction of the anisotropic magnetization M2 in the plane of the magnetic films (the case of the lower magnetic films 11B and 11D, and the case of the upper magnetic films 14B and 14D), when a fixed magnetic field H22 is applied in a direction orthogonal to the magnetization direction of the anisotropic magnetization M2 in the plane of the magnetic films, displacement (rotation) of the magnetization direction of the anisotropic magnetization M2 is pinned by the scratch-like grooves 16 or 17, thereby the magnetization direction of the anisotropic magnetization M2 is prevented from being displaced (rotated) to the application direction of the fixed magnetic field H22. That is, the magnetization direction of the anisotropic magnetization M2 and the extending direction of the scratch-like grooves 16 or 17 have a predetermined angle θ (0°<θ<90°: acute angle) with respect to each other. In this way, the thin film device 1 as shown in FIGS. 1 and 2 is manufactured.

More specifically, the displacement (rotation) of the anisotropic magnetization as shown in FIGS. 10A and 10B can be described as follows. That is, rearrangement of magnetic atoms occurs in the magnetic film due to heat treatment in the magnetic field as described above, so that the magnetization easy axis (magnetization direction of the anisotropic magnetization) can be controlled in a desired direction. In this case, the transfer rate of magnetic atoms is expressed by the following expression (1) assuming that the surface free energy is γ, the volume diffusion coefficient is D, the Boltzmann coefficient is k, and volume of a magnetic atom is Ω. Since mobility of a magnetic atom is in inverse proportion to the transfer rate, the mobility E of the magnetic atom in this case is expressed by the following expression (2) assuming that the proportional constant is α. Here, a surface of an object has obstacles to transfer of atoms such as lattice defects or fine irregularity, causing formation of barrier energy. Therefore, for example, as shown in FIG. 10A, in the case that the extending direction of the scratch-like grooves 16 or 17 is approximately orthogonal to the magnetization direction of the anisotropic magnetization M1 in the plane of the magnetic films, or in the case that the scratch-like grooves 16 or 17 themselves are not formed (the case of the lower magnetic films 11A and 11C, and the case of the upper magnetic films 14A and 14C), when the fixed magnetic field H21 is applied in such orthogonal direction in the plane of the magnetic films, since a state is relatively stable when the magnetization direction of the anisotropic magnetization M1 is approximately parallel to the extending direction of the scratch-like grooves 16 or 17, the magnetization direction of the anisotropic magnetization M1 is easily displaced (rotated) to the application direction of the fixed magnetic field H21. On the other hand, for example, as shown in FIG. 10B, in the case that the extending direction of the scratch-like grooves 16 or 17 is approximately parallel to the magnetization direction of the anisotropic magnetization M2 in the plane of the magnetic films (the case of the lower magnetic films 11B and 11D, and the case of the upper magnetic films 14B and 14D), when the fixed magnetic field H22 is applied in the direction orthogonal to the magnetization direction of the anisotropic magnetization M2 in the plane of the magnetic films, if the anisotropic magnetization M2 is directly displaced (rotated) in the application direction of the fixed magnetic field H22, since the anisotropic magnetization M2 runs on convex portions of the scratch-like grooves 16 or 17, an energetically unstable state is given. When an angle formed by the extending direction of the scratch-like grooves 16 or 17 and a direction of the applied magnetic field is assumed as $\phi$, a level of energy of a magnetic atom for running on one of the convex portions of the scratch-like grooves 16 or 17 against a barrier due to a convex portion is expressed by the following expression (3) assuming that U(h/t) is a function of (h/t) expressing height of the potential barrier, t is thickness of the magnetic film, and his height of the convex portion. Consequently, according to the expressions (2) and (3), the anisotropic magnetization M2 is displaced (rotated) within a range satisfying a conditional expression expressed by the following expression (4). In this way, displacement (rotation) of the magnetization direction of the anisotropic magnetization M2 is pinned by the scratch-like grooves 16 or 17, thereby the magnetization direction of the anisotropic magnetization M2 is prevented from being displaced (rotated) to the application direction of the fixed magnetic field H22 as described before. Since a domain created by magnetic atoms needs to sufficiently sense the potential, an interval between the convex portions of the scratch-like grooves 16 or 17 is desirably about 1/10 of width of a magnetic wall, for example, desirably 20 μm or less.

$$\text{Transfer rate of atom} = 2.5\pi\gamma D\Omega/kT \quad (1)$$

$$E = \alpha kT/\gamma D\Omega \quad (2)$$

Level of energy that magnetic atom runs on=−U(h/t)
$$*\cos\phi \quad (3)$$

$$\alpha kT/\gamma D\Omega > -U(h/t)*\cos\phi \quad (4)$$

In the above-described method of manufacturing the thin film inductor 1, after formation of the lower magnetic film 11 and the upper magnetic film 14, the heat treatment is performed while applying the fixed magnetic field H1, and thus the lower magnetic film 11 and the upper magnetic film 14 previously have uniaxial anisotropy along the Y-axis direction (have a magnetization easy axis along the Y-axis direction). However, the lower magnetic film 11 and the upper magnetic film 14 may previously have the uniaxial anisotropy along the Y-axis direction (have the magnetization easy axis along the Y-axis direction) by forming the lower magnetic film 11 and the upper magnetic film 14 while applying the fixed magnetic field H1 by using, for example, DC magnetron sputtering. In the case of manufacturing in this way, the thin film inductor 1 similar to the above can be produced.

Figure 11A:
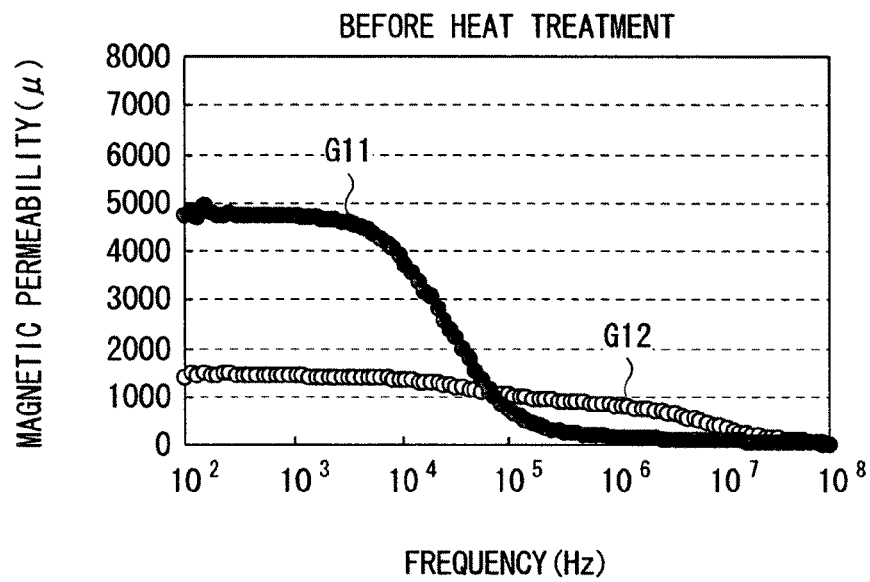
FIGS. 11A to 11B are characteristic diagrams showing an example of frequency dependency of magnetic permeability in a divided area respectively.
Figure 11B:
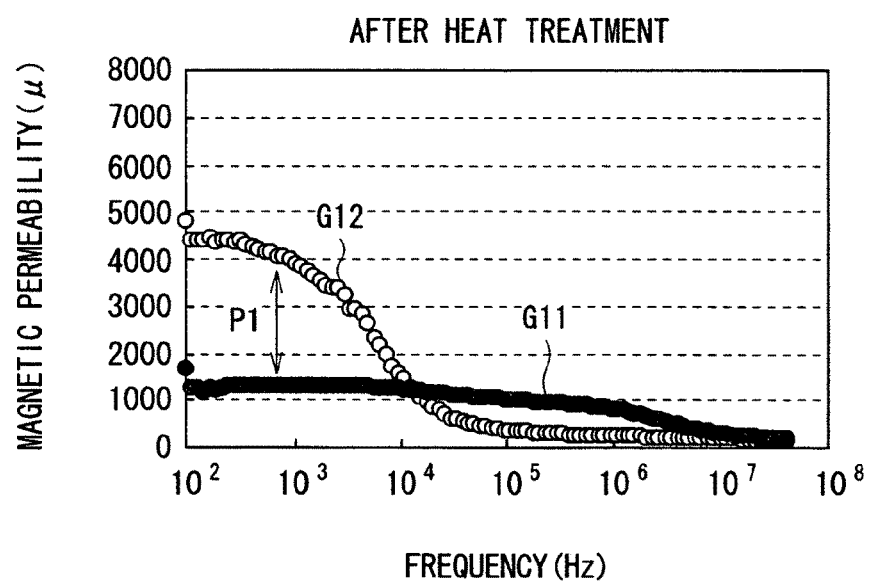
Figure 12A:
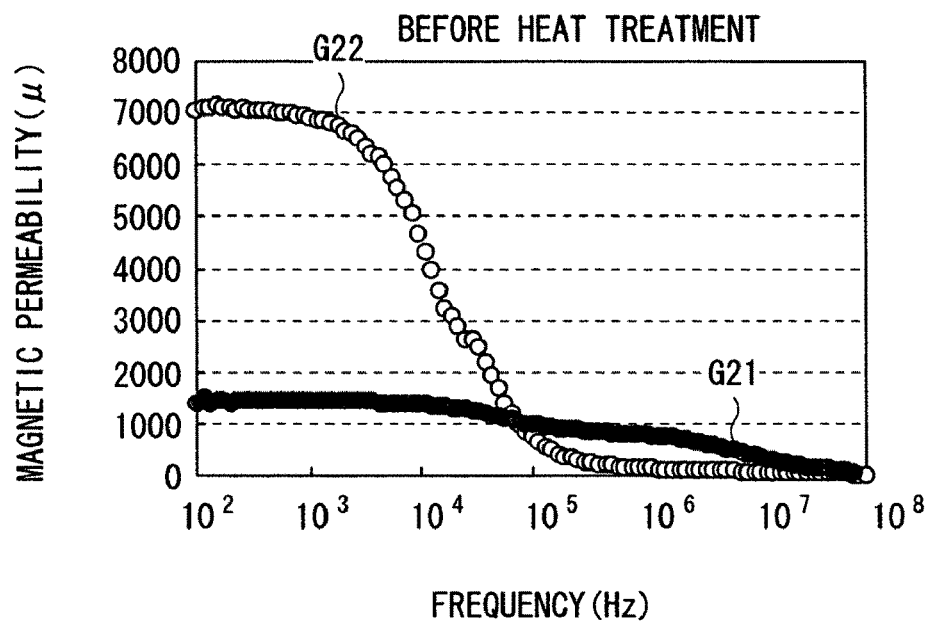
FIGS. 12A to 12B are characteristic diagrams showing another example of frequency dependency of magnetic permeability in a divided area respectively.
Figure 12B:
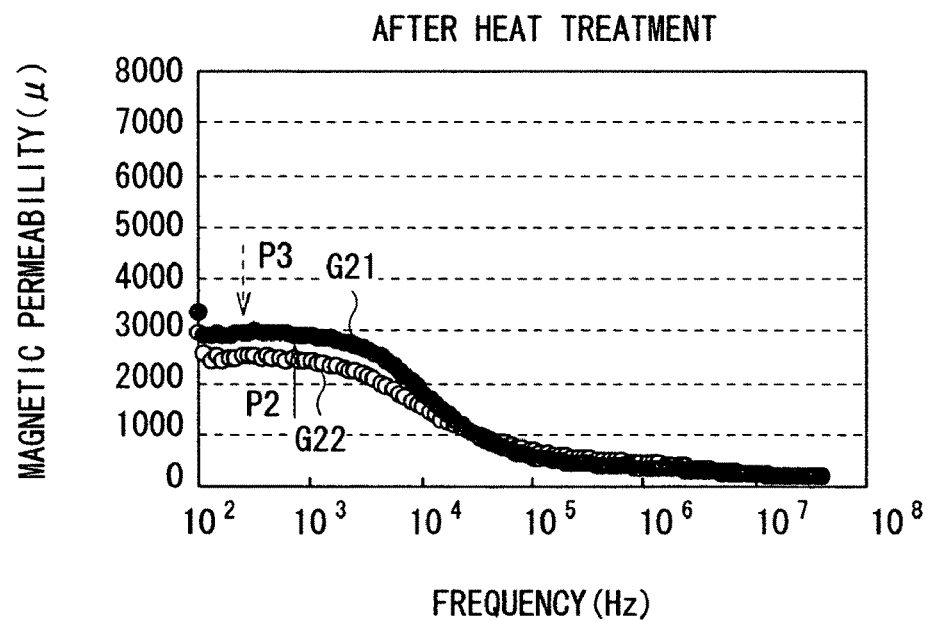

In this way, in the thin film inductor 1 of the embodiment, since the scratch-like grooves 16 and 17 extending along the extending direction (Y-axis direction) of the second coil part of the coil 13 are formed on the backs of the lower magnetic film 11 and the upper magnetic film 14 respectively, the magnetization directions of the anisotropic magnetization Mb and Md are controlled in formation areas of the scratch-like grooves 16 and 17 (formation areas of the lower magnetic films 11B and 11D, and the upper magnetic films 14B and 14D). That is, when the fixed magnetic field H2 is applied in a direction (X-axis direction) orthogonal to the extending direction of the second coil part in the plane of the magnetic films (X-Y plane), displacement (rotation) of each of the magnetization directions of the anisotropic magnetization Mb and Md is pinned by the scratch-like grooves 16 and 17, thereby each of the magnetization directions of the anisotropic magnetization Mb and Md is prevented from being displaced (rotated) to the application direction of the magnetic field (X-axis direction). Therefore, regarding the anisotropic magnetization Ma and Mc, for example, as shown in FIGS. 11A and 11B, a frequency characteristic G11 of magnetic permeability in the X-axis direction and a frequency characteristic G12 of magnetic permeability in the Y-axis direction are changed to each other as shown by a sign P1 in the figure before and after heat treatment in the magnetic field due to the fixed magnetic field H2. On the other hand, regarding the anisotropic magnetization Mb and Md, for example, as shown in FIGS. 12A and 12B, a frequency characteristic G21 of magnetic permeability in the X-axis direction and a frequency characteristic G22 of magnetic permeability in the Y-axis direction are not perfectly changed to each other as shown by signs P2 and P3 in the figure before and after the heat treatment in the magnetic field due to the fixed magnetic field H2, and kept in a state in the middle of displacement. Therefore, as the frequency characteristic G21 of the magnetic permeability in the X-axis direction and the frequency characteristic G22 of the magnetic permeability in the Y-axis direction are not perfectly changed to each other and kept in such a way, magnetic permeability is accordingly kept and improved (for example, improved by about 50%) in a high frequency range. Moreover, formation of such scratch-like grooves 16 and 17 does not cause complexity in manufacturing process.

Figure 13A:
FIGS. 13A to 13B and 13C are microscopic photographs and a schematic section diagram showing an example of the scratch-like grooves respectively.
Figure 13B:
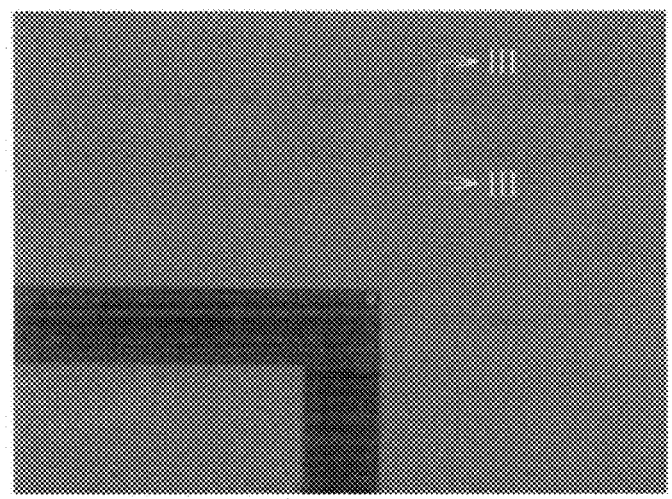
Figure 13C:
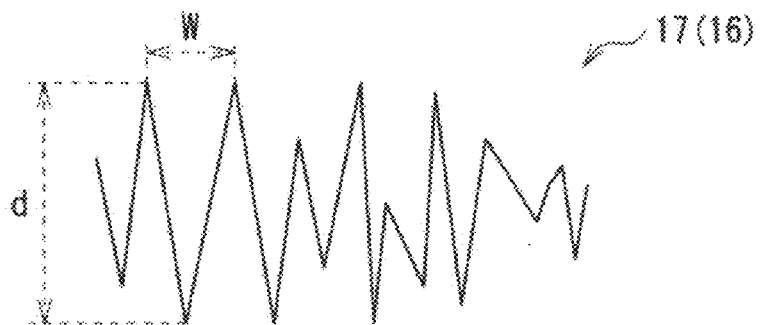
Figure 14:
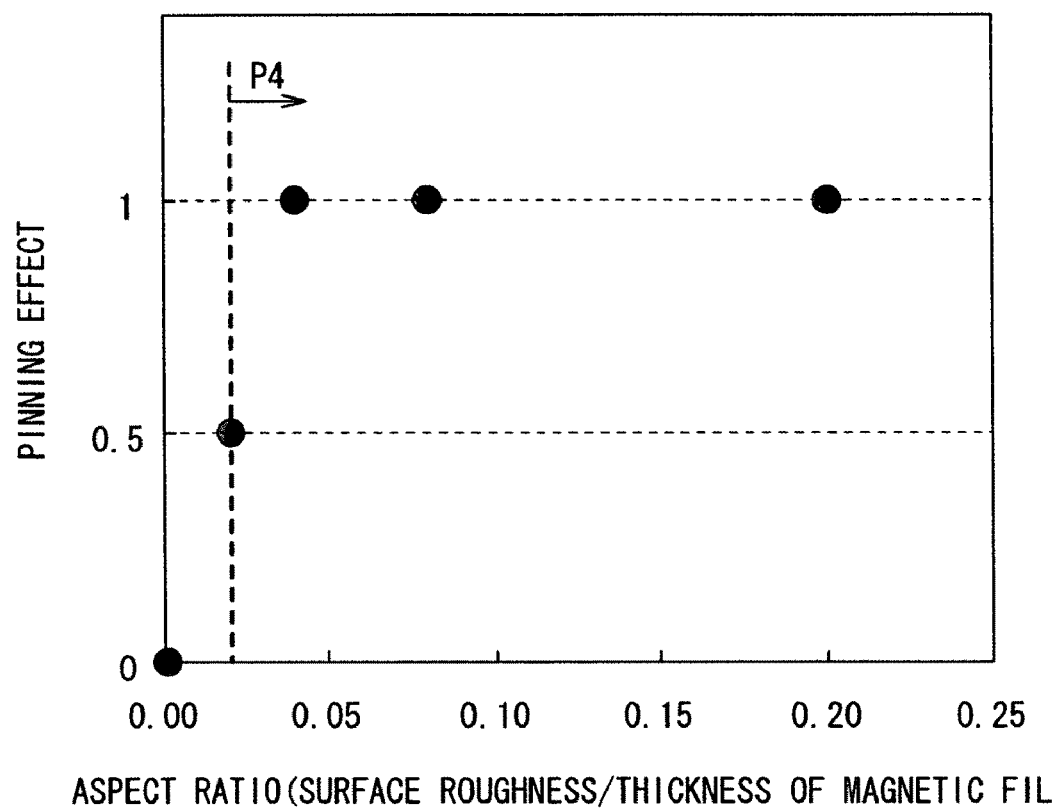
FIG. 14 is a characteristic diagram showing a relationship between a ratio of surface roughness to thickness of a magnetic film, and a pinning effect.

Next, magnetic characteristics of the thin film inductor 1 are described in detail with reference to FIGS. 13A to 13C, FIG. 14 and Table 1. Here, FIG. 13A shows a microscopic image showing an example of a planar configuration of the lower magnetic film 11 or the upper magnetic film 14 in an enlarged manner, FIG. 13B shows a microscopic image showing part of FIG. 13A in an enlarged manner, and FIG. 13C schematically shows a configuration in cross section of a portion taken along a line III-III of FIG. 13B. FIG. 14 and Table 1 show a relationship between an aspect ratio of the lower magnetic film 11 or the upper magnetic film 14 (=ratio of surface roughness to thickness of the lower magnetic film 11 or the upper magnetic film 14), and presence of a pinning effect on the anisotropic magnetization Ma to Md. FIG. 14 and Table 1 show presence of the pinning effect respectively, where "0" shows no pinning effect (no controllability of the anisotropic magnetization Ma to Md), "0.5" shows certain pinning effect (certain controllability of the anisotropic magnetization Ma to Md), and "1" shows a sufficient pinning effect (sufficient controllability of the anisotropic magnetization Ma to Md).

TABLE 1

| Surface roughness (μm) | 0.005 | 0.200 | 0.200 | 0.400 | 0.200 |
|---|---|---|---|---|---|
| Thickness of magnetic | 5 | 10 | 5 | 5 | 1 |

TABLE 1-continued

| film (μm) | | | | | |
|---|---|---|---|---|---|
| Ratio of surface roughness to thickness of magnetic film | 0.001 | 0.020 | 0.040 | 0.080 | 0.200 |
| Presence of pinning effect | 0 | 0.5 | 1 | 1 | 1 |

1; sufficient controllability
0.5; certain controllability
0; no controllability First, from the microscopic images shown in FIGS. 13A and 13B, it is known that the scratch-like grooves 16 or 17 along one direction are actually formed on the lower magnetic film 11 or the upper magnetic film 14. Moreover, it is known from the schematic section diagram shown in FIG. 13C that width "w" of a groove of the scratch-like grooves 16 or 17 is actually about 5 to 20 μm, and depth "d" of a groove thereof is actually about 0.2 to 0.4 μm.

From FIG. 14 and Table 1, it is known that when an aspect ratio of the lower magnetic film 11 or the upper magnetic film 14 is increased, specifically when the aspect ratio is 0.02 or more, certain pinning effect is exhibited on the anisotropic magnetization Ma to Md, and when the ratio is 0.04 or more, the pinning effect is perfectly exhibited. The reason for this is considered as follows: as a value of surface roughness of the lower magnetic film 11 or the upper magnetic film 14 increases, pinning to the anisotropic magnetization Ma to Md more easily occurs. Consequently, the aspect ratio of the lower magnetic film 11 or the upper magnetic film 14 is preferably 0.02 or more, and more preferably 0.04 or more.

As hereinbefore, in the embodiment, since the scratch-like grooves 16 and 17 extending along the extending direction (Y-axis direction) of the second coil part of the coil 13 are formed on the backs of the lower magnetic film 11 and the upper magnetic film 14, the magnetization directions of the anisotropic magnetization Mb and Md can be controlled in the formation areas of the scratch-like grooves 16 and 17 (formation areas of the lower magnetic films 11B and 11D, and the upper magnetic film 14B and 14D), so that displacement (rotation) of the magnetization directions of the anisotropic magnetization Mb and Md can be pinned by the scratch-like grooves 16 and 17. Consequently, certain magnetic permeability can be kept even in the high frequency range. Moreover, formation of such scratch-like grooves 16 and 17 does not cause complexity in manufacturing process. Accordingly, magnetic permeability can be easily improved in the high frequency range.

Moreover, since anisotropic magnetization can be pinned in this way, even if heat treatment is performed in a step after the thin film inductor is formed, displacement of a magnetization direction of the anisotropic magnetization can be avoided, consequently high magnetic permeability can be kept in the high frequency range.

Furthermore, when the aspect ratio of the lower magnetic film 11 or upper magnetic film 14 is 0.02 or more (more preferably 0.04 or more), the magnetization directions of the anisotropic magnetization Mb and Md can be easily controlled in the formation areas of the scratch-like grooves 16 and 17.

While the embodiment was described with a case that the scratch-like grooves 16 and 17 were discontinuously formed along the extending direction (Y-axis direction) of the second coil part, the scratch-like grooves 16 and 17 may be continuously formed. However, when the scratch-like grooves 16 and 17 are discontinuously formed as in the embodiment, decrease in volume of the lower magnetic film 11 or the upper magnetic film 14 can be reduced compared with a case that they are continuously formed. In other words, since volume of the lower magnetic film 11 or the upper magnetic film 14 can be increased compared with the case that they are continuously formed, inductance of the thin film inductor can be further improved. This is the same in the following second and third embodiments.

Second Embodiment

Next, a second embodiment of the invention is described. A thin film inductor of the embodiment is manufactured by a different method from the method of manufacturing the thin film inductor 1 of the first embodiment. Since basic operation of the thin film inductor of the embodiment is the same as in the first embodiment, description of such operation is omitted.

Figure 15:
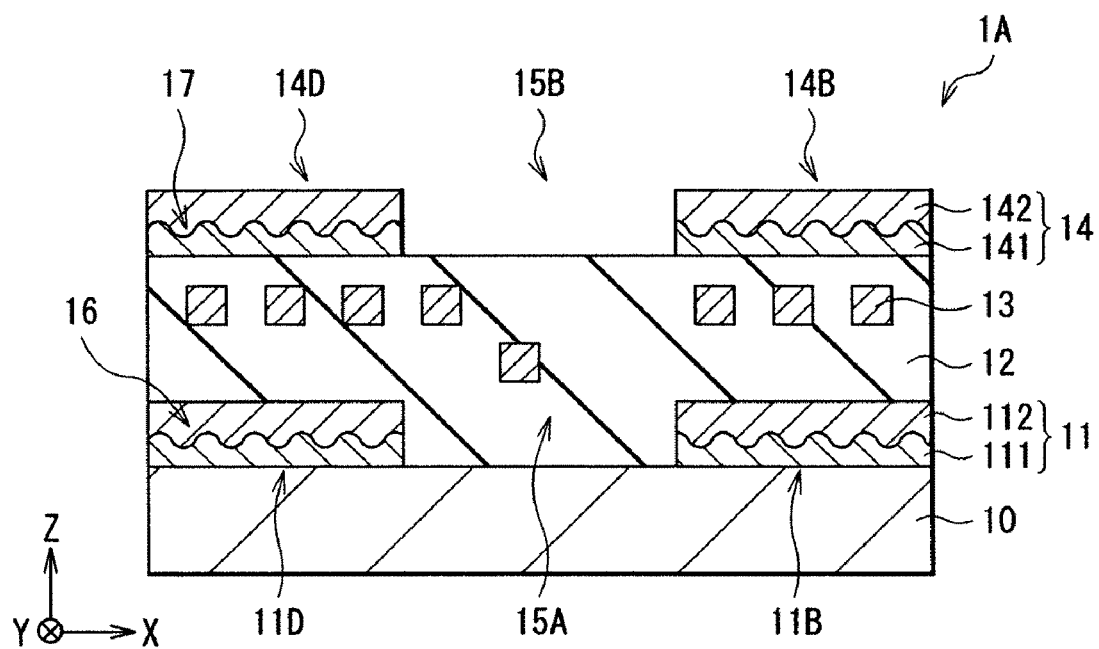
FIG. 15 is a cross section diagram showing a configuration of a thin film magnetic device according to a second embodiment of the invention.

FIG. 15 shows a configuration in an X-Z section of the thin film inductor (thin film inductor 1A) according to the embodiment. In the figure, the same components as the components shown in FIG. 2 are marked with the same references, and appropriately omitted to be described. In the thin film inductor 1A, a lower magnetic film 11 has a configuration of a pair of lower magnetic films 111 and 112 being stacked, and an upper magnetic film 14 also has a configuration of a pair of upper magnetic films 141 and 142 being stacked in a second pair of divided areas (formation areas of the lower magnetic films 11A and 11C, and the upper magnetic films 14A and 14C). On the other hand, the lower magnetic film 11 includes only the lower magnetic film 112, and the upper magnetic film 14 includes only the upper magnetic film 142 in a first pair of divided areas (formation areas of the lower magnetic films 11B and 11D, and the upper magnetic films 14B and 14D). Moreover, scratch-like grooves 16 and 17 are formed along an extending direction (Y-axis direction) of a second coil part on surfaces of the lower magnetic film 111 and the upper magnetic film 141 respectively, so that in the second pair of divided areas, scratch-like grooves having shapes indirectly corresponding to formation patterns of the scratch-like grooves 16 and 17 are formed even at back sides of the lower magnetic film 112 and the upper magnetic film 142 respectively. Each of the lower magnetic film 111 and the upper magnetic film 141 corresponds to a specific example of the "dummy layer" in the invention. Thus, the dummy layer may include a film other than the magnetic film.

Figure 16:
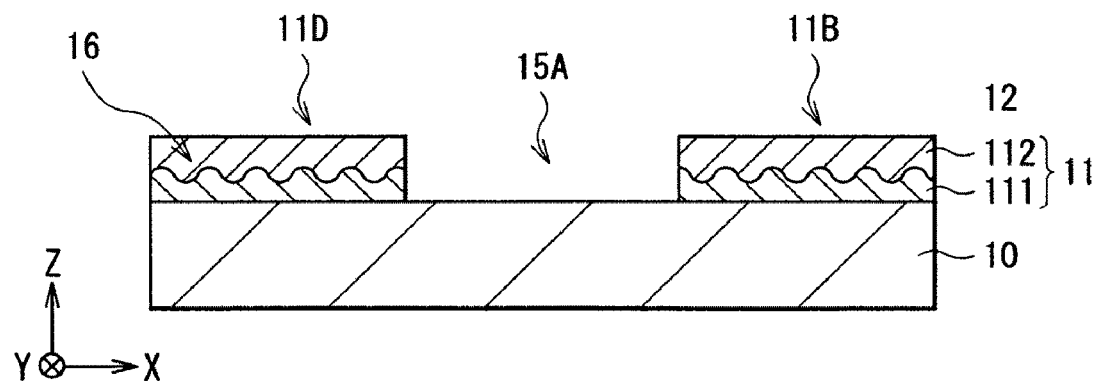
FIG. 16 is a cross section diagram for illustrating a method of manufacturing the thin film magnetic device shown in FIG. 15.

Next, an example of a method of manufacturing the thin film inductor 1A of the embodiment is described with reference to FIGS. 16 to 18B. FIGS. 16 to 18B show an example of the method of manufacturing the thin film inductor 1A. FIG. 16 shows a configuration in the X-Z section, and FIGS. 17A to 17C and 18A to 18B show a configuration in the X-Y plane, respectively. The configuration in the X-Y plane is shown in a simplified manner while the coil 13 is omitted to be shown.

First, as shown in FIG. 16, the lower magnetic film 11 is formed on a substrate 10, the lower magnetic film having an opening 15A and having the scratch-like grooves 16 in the second pair of divided areas.

Figure 17A:
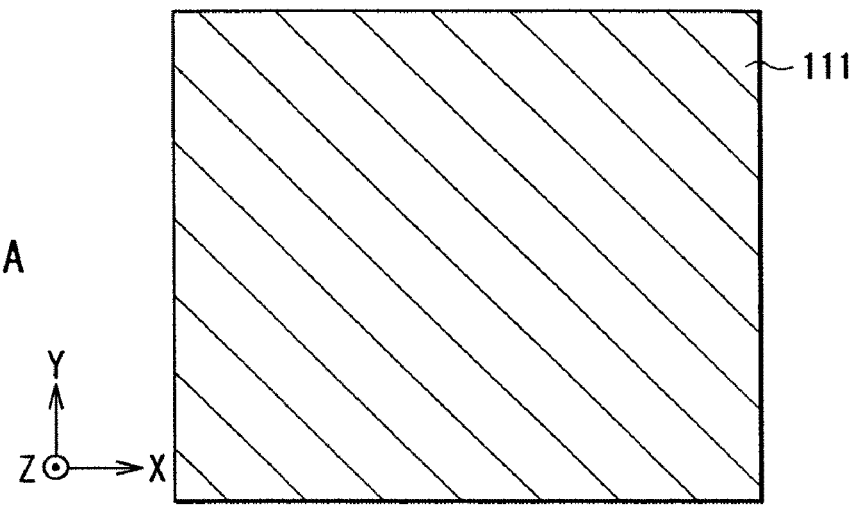
FIGS. 17A to 17C are plan diagrams for illustrating a method of manufacturing the sectional configuration as shown in FIG. 16 respectively.
Figure 17B:
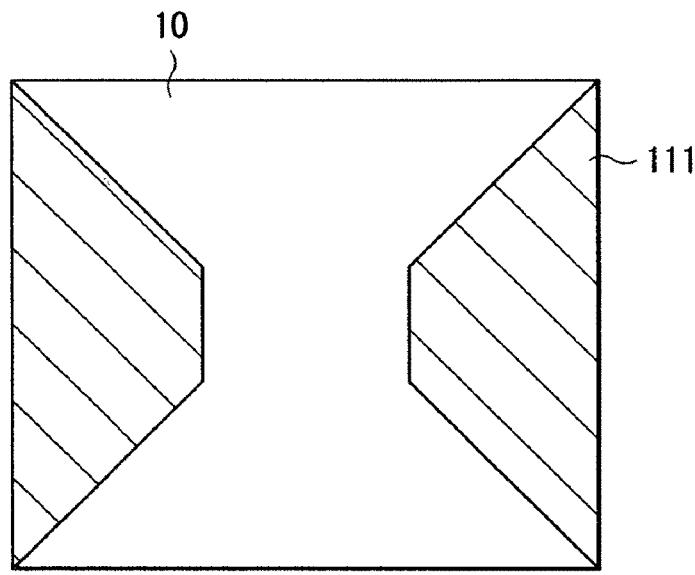

Specifically, first, as shown in FIG. 17A, the lower magnetic film 111 to be the dummy layer is uniformly formed on the substrate 10 by, for example, sputtering or plating. Thickness of the lower magnetic film 111 is set to be, for example, about 500 nm. Then, as shown in FIG. 17B, the lower magnetic film 111 is patterned using, for example, photolithography so that the lower magnetic film 111 is removed from a surface of the substrate except for the second pair of divided areas in which the second coil part is to extend.

Figure 17C:
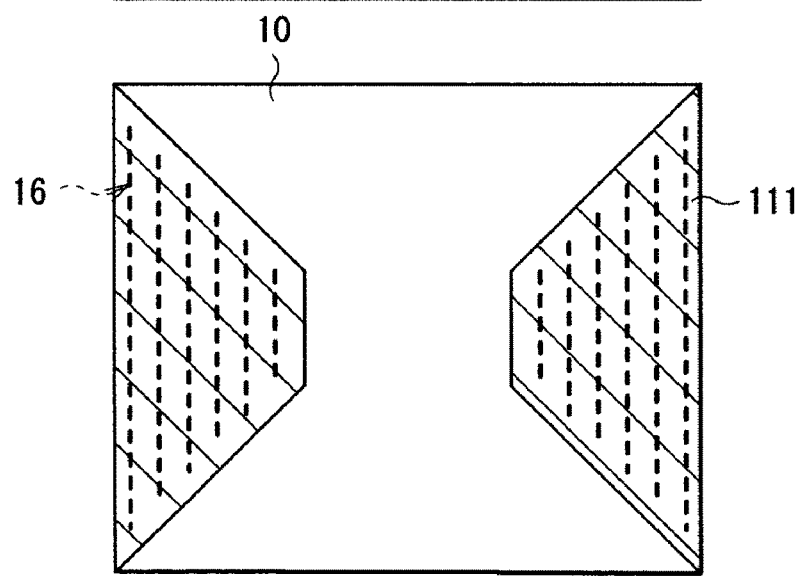

Next, as shown in FIG. 17C, a surface of the lower magnetic film 111 is, for example, polished in a selective manner, thereby the scratch-like grooves 16 are uniformly formed on a surface of the lower magnetic film 111, the scratch-like grooves 16 being to extend along the extending direction (Y-axis direction) of the second coil part of the coil 13. Thus, the scratch-like grooves 16 are formed only in the second pair of divided areas. Width of a groove of the scratch-like grooves 16 is, for example, about 5 to 20 μm, and depth of a groove thereof is, for example, about 0.2 to 0.4 μm.

Next, as shown in FIG. 18A, the lower magnetic film 112 is uniformly formed on the substrate 10 and on the lower magnetic film 111 having the scratch-like grooves 16 formed thereon by, for example, sputtering or plating. Thus, scratch-like grooves having a shape indirectly corresponding to formation patterns of the scratch-like grooves 16 are formed only at a back side of the lower magnetic film 112 in the second pair of divided areas (specifically, formation areas of the lower magnetic films 11B and 11D). Thickness of the lower magnetic film 112 is set to be, for example, about 5 to 15 μm. Then, as shown in FIG. 18B, the lower magnetic films 111 and 112 are etched using a predetermined etching material to form an opening 15A. Thus, a section structure as shown in FIG. 16 is formed.

After that, first, an insulating film 12 and the coil 13 are formed on the substrate 10 and the lower magnetic film 11 as in the first embodiment. Next, as in the steps described using FIGS. 16 to 18B, the upper magnetic film 14 is formed on the insulating film 12, the upper magnetic film having the opening 15B and having the scratch-like grooves 17 in the second pair of divided areas as shown in FIG. 15. Then, as in the first embodiment, heat treatment is performed while applying a fixed magnetic field H1 in a direction (Y-axis direction) approximately parallel to an extending direction of the second coil part and to an extending direction of the scratch-like grooves 16 or 17, in a plane (X-Y plane) of the lower and upper magnetic films 11 and 14. Then, heat treatment is performed in the plane (X-Y plane) of the stacked lower and upper magnetic films 11 and 14 while applying a fixed magnetic field H2 in a direction (X-axis direction) orthogonal to an application direction (Y-axis direction) of the fixed magnetic field H1. Thus, the thin film inductor 1A as shown in FIG. 15 is manufactured through the same operation as in the first embodiment.

In this way, in the embodiment, since the scratch-like grooves 16 and 17 extending along the extending direction (Y-axis direction) of the second coil part of the coil 13 are formed on the backs of the lower magnetic film 112 and the upper magnetic film 142 respectively in the second pair of divided areas, the same advantage as in the first embodiment can be obtained through the same operation. That is, magnetic permeability in a high frequency range can be easily improved.

Third Embodiment

Next, the third embodiment of the invention is described. In a thin film inductor of the embodiment, the scratch-like grooves 16 and 17 are formed in formation areas of the first coil parts (first pair of divided areas) in addition to formation areas of the second coil parts (second pair of divided areas), and the scratch-like grooves 16 and 17 are formed by using a nano stamper in place of polishing.

Figure 19:
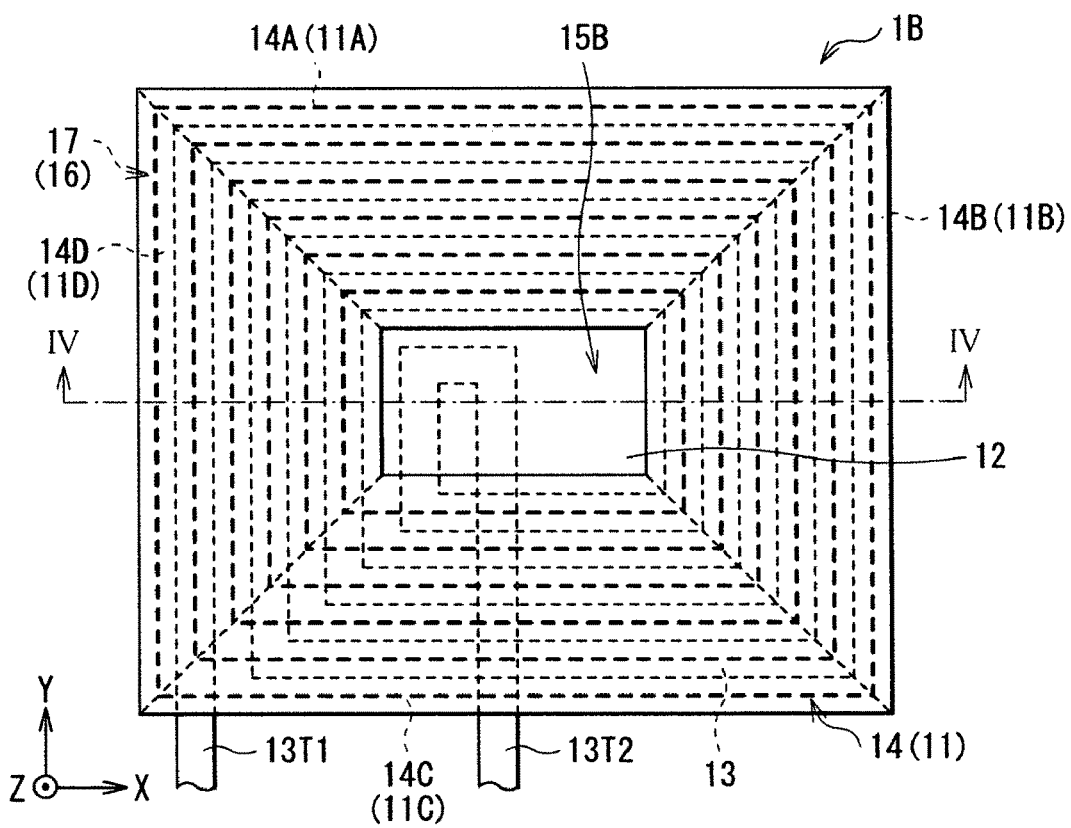
FIG. 19 is a plan diagram showing a configuration of a thin film magnetic device according to a third embodiment of the invention.
Figure 20:
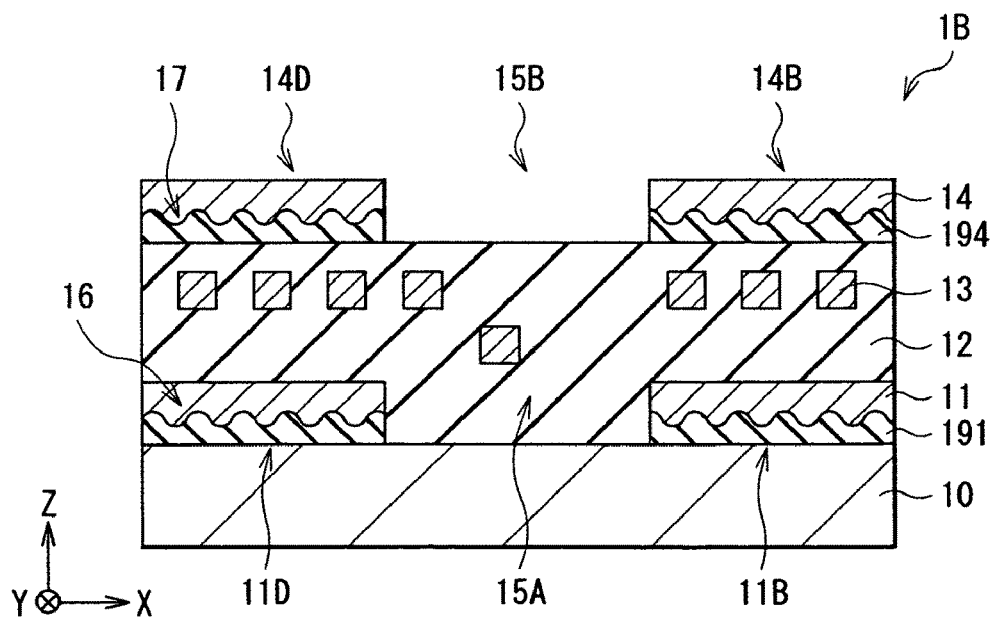
FIG. 20 is a cross section diagram showing the configuration of the thin film magnetic device taken along a line IV-IV of FIG. 19.

FIGS. 19 and 20 show a configuration of the thin film inductor (thin film inductor 1B) according to the embodiment respectively. FIG. 19 shows a configuration in the X-Y plane, and FIG. 20 shows a configuration in the X-Z section along a line IV-IV shown in FIG. 19, respectively. In the figures, the same components as the components shown in FIGS. 1 and 2 are marked with the same references, and appropriately omitted to be described. In the thin film inductor 1B, a resin film 191 is formed at a back side of the lower magnetic film 11 (between a substrate 10 and the lower magnetic film 11), and a resin film 194 is formed at a back side of the upper magnetic film 14 (between an insulating film 12 and an upper magnetic film 14). Moreover, scratch-like grooves 16 and 17 are formed along extending directions (X-axis direction and Y-axis direction) of a coil 13 (first and second coil parts) on surfaces of the resin films 191 and 194 respectively, so that scratch-like grooves having shapes indirectly corresponding to formation patterns of the scratch-like grooves 16 and 17 are formed even at back sides of the lower magnetic film 11 and the upper magnetic film 14 respectively.

The resin films 191 and 194 are made of thermoplastic resin such as PMMA (polymethylmethacrylate) or fluorine resin.

Next, an example of a method of manufacturing the thin film inductor 1B of the embodiment is described with reference to FIGS. 21 to 24C. FIGS. 21 to 24C show an example of the method of manufacturing the thin film inductor 1B respectively. FIGS. 21 to 23C show a configuration in the X-Z section, and FIGS. 24A to 24C show a configuration in the X-Y plane, respectively. The configuration in the X-Y plane in FIGS. 23A to 23C is shown in a simplified manner while the coil 13 is omitted to be shown.

Figure 21:
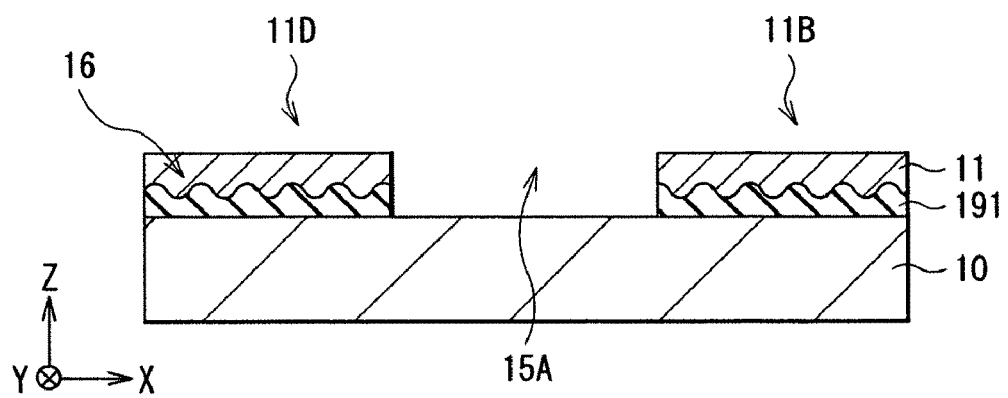
FIG. 21 is a cross section diagram for illustrating a method of manufacturing the thin film magnetic device shown in FIGS. 19 and 20.

First, as shown in FIG. 21, the resin film 191 having an opening 15A and the scratch-like grooves 16, and the lower magnetic film 11 are formed on a substrate 10.

Figure 22A:
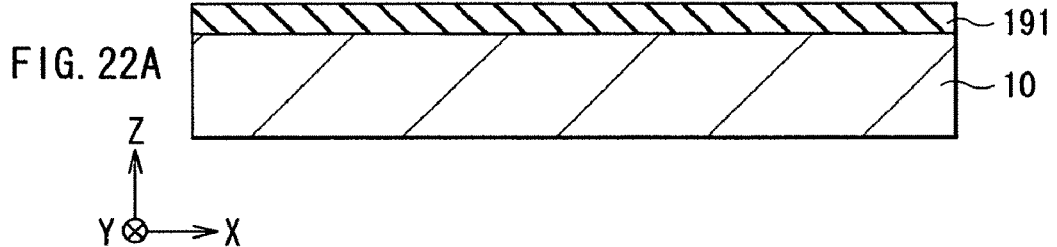
FIGS. 22A to 22B are cross section diagrams for illustrating a method of manufacturing the sectional configuration as shown in FIG. 21 respectively.
Figure 22B:
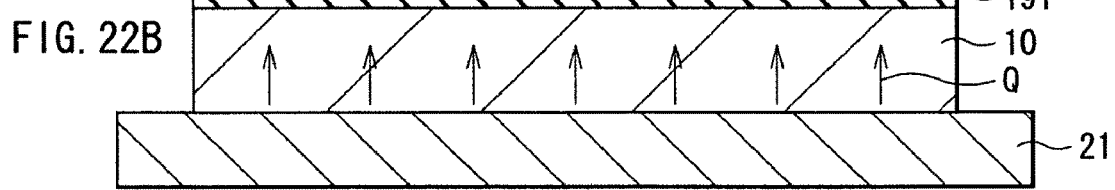

Specifically, first, as shown in FIG. 22A, the resin film 191 including the above-described material is uniformly formed on the substrate 10 by, for example, spin coating. Thickness of the resin film 191 is set to be, for example, about 200 nm. Then, the substrate 10 and the resin film 191 are set on a heating stage 21 as shown in FIG. 22B, so that the resin film 191 is supplied with heat Q via the substrate 10 to heat the resin film 191. Temperature of the heating stage 21 is set to be, for example, about 200° C., and heating is performed, for example, for about 10 min.

Figure 23A:
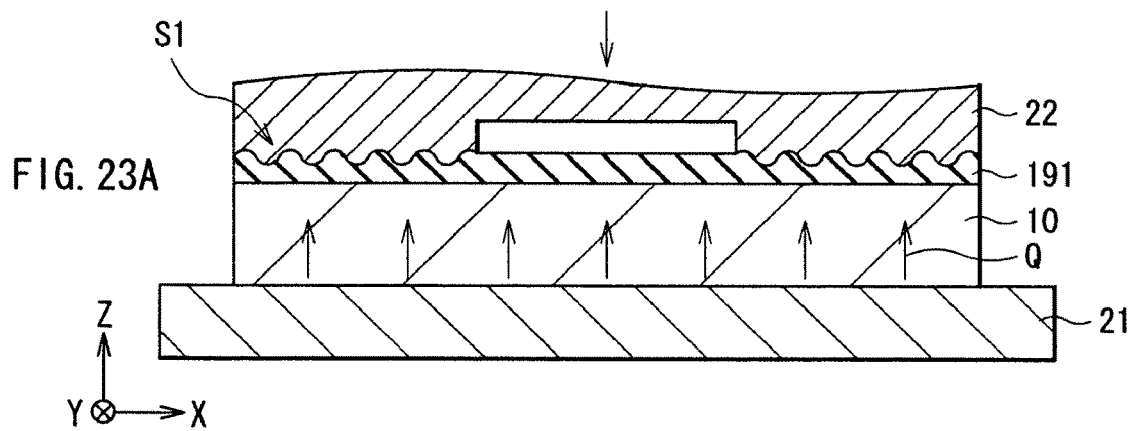
FIGS. 23A to 23C are cross section diagrams following FIG. 22B for illustrating the method of manufacturing the sectional configuration respectively.
Figure 23B:
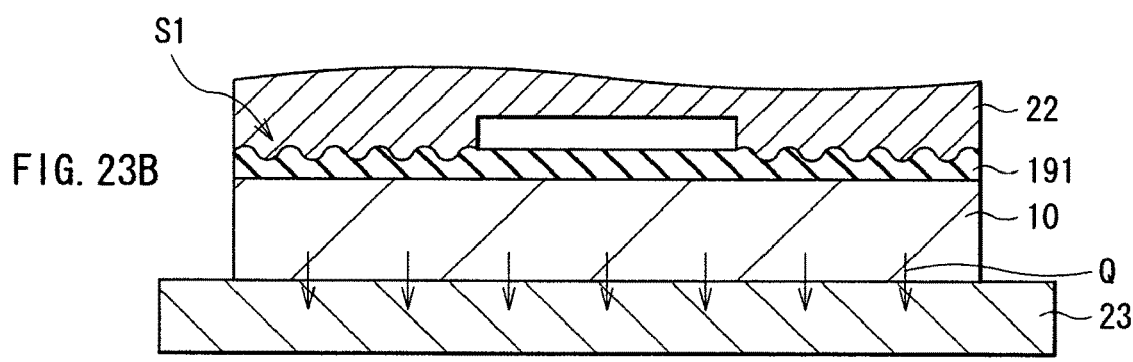
Figure 23C:
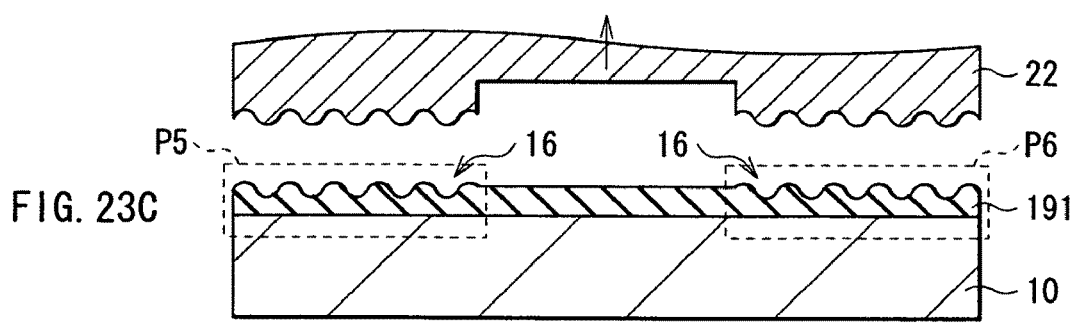
Figure 24A:
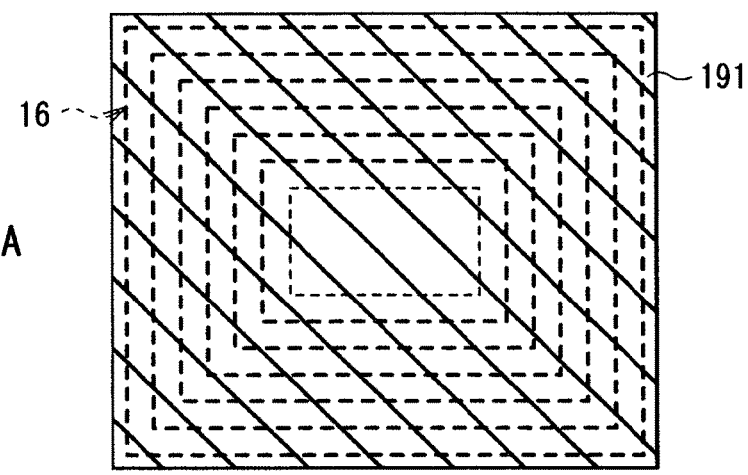
FIGS. 24A to 24C are plan diagrams following FIG. 23C for illustrating the method of manufacturing the sectional configuration.
Figure 24B:
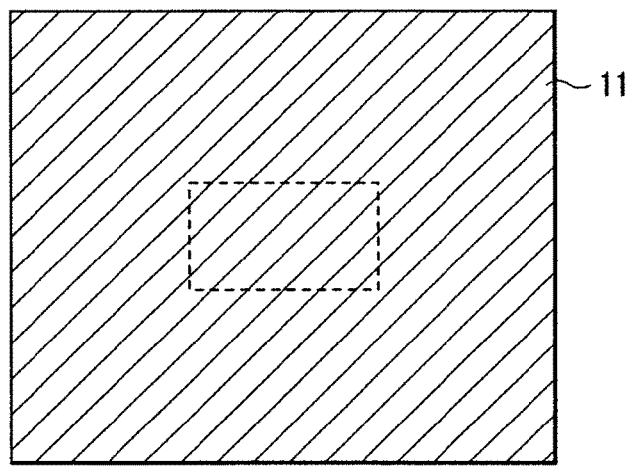
Figure 24C:
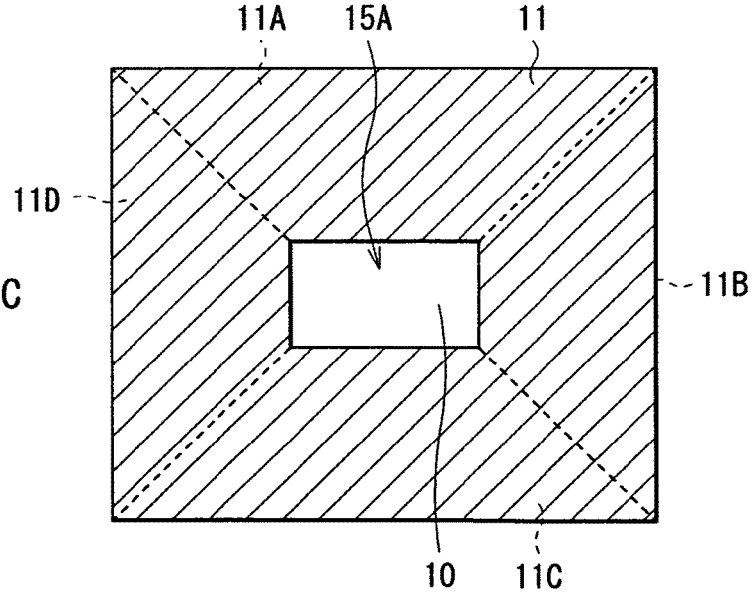

Next, as shown in FIG. 23A, while keeping such a situation, a nano stamper 22 having a surface S1 in a shape corresponding to a formation pattern of the scratch-like grooves 16 is pressed to a surface of the resin film 191. This condition is kept, for example, for 15 sec.

Next, the substrate 10, resin film 191, and nano stamper 22 are set on a cooling stage 23 as shown in FIG. 23B, so that the heat Q is taken from the resin film 191 via the substrate 10 and thus the resin film 191 is cooled. Temperature of the cooling stage 23 is set to be, for example, about 20° C., and cooling is performed for, for example, about 5 min. Then, the nano stamper 22 is separated from the surface of the resin film 191 as shown in FIG. 23C, so that the scratch-like grooves 16 along an extending direction of the coil 13 are formed on the surface of the resin film 191 as shown by signs P5 and P6 in the figure, and as shown in FIG. 24A.

Next, as shown in FIG. 24B, the lower magnetic film 11 is uniformly formed on the resin film 191 having the scratch-like grooves 16 formed thereon by, for example, sputtering or plating. Thickness of the lower magnetic film 11 is set to be, for example, about 5 to 15 μm. Then, as shown in FIG. 24C, the resin film 191 and the lower magnetic film 11 are etched using a predetermined etching material to form an opening 15A. Thus, a section structure as shown in FIG. 21 is formed.

After that, first, an insulating film 12 and the coil 13 are formed on the substrate 10 and on the lower magnetic film 11 as in the first and second embodiments. Next, as in the steps described using FIGS. 21 to 24C, the resin film 194 having an opening 15B and having the scratch-like grooves 17, and the upper magnetic film 14 are formed on the insulating film 12 as shown in FIGS. 19 and 20. Then, as in the first and second embodiments, heat treatment is performed while applying a fixed magnetic field H1 in a direction (Y-axis direction) approximately parallel to an extending direction of the second coil part in a plane (X-Y plane) of the lower and upper magnetic films 11 and 14. Then, heat treatment is performed in the plane (X-Y plane) of the lower and upper magnetic films 11 and 14 while applying a fixed magnetic field H2 in a direction (X-axis direction) orthogonal to an application direction (Y-axis direction) of the fixed magnetic field H1. Thus, the thin film inductor 1B as shown in FIG. 15 is manufactured by the same operation as in the first and second embodiments.

In this way, in the embodiment, since the scratch-like grooves 16 and 17 extending in all the four divided areas along the extending direction of the coil 13 (X-axis direction and Y-axis direction) are formed on the backs of the lower magnetic film 11 and the upper magnetic film 14, the same advantage as in the first embodiment can be obtained through the same operation. That is, magnetic permeability in a high frequency range can be easily improved.

Figure 25:
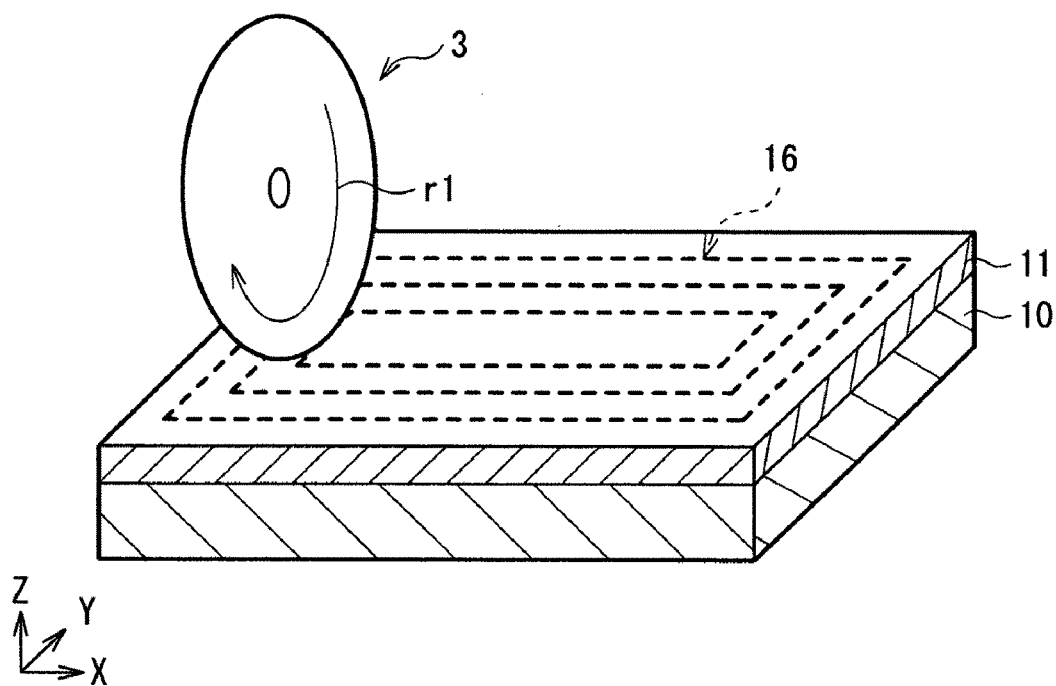
FIG. 25 is a perspective diagram for illustrating a method of forming the scratch-like grooves according to a modification of the third embodiment.
Figure 26:
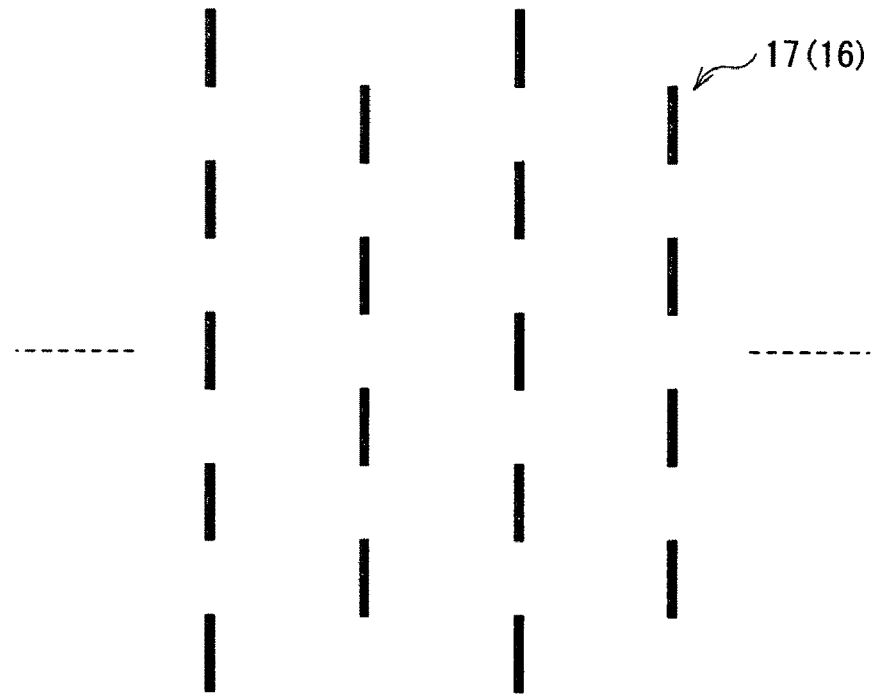
FIG. 26 is a schematic plan diagram showing a formation pattern of scratch-like grooves according to a modification of the invention.

While the embodiment was described with a case that the scratch-like grooves 16 and 17 extending in all the four divided areas along the extending direction of the coil 13 were formed by pressing the nano stamper 22 having a predetermined shape to the surfaces of the resin films 191 and 194, such scratch-like grooves 16 and 17 may be directly (or indirectly) formed on the surface of the lower magnetic film 11 or the upper magnetic film 14 by using, for example, a dicer 3 as shown in FIG. 25. When the scratch-like grooves 16 and 17 are formed in this way, they can be easily formed compared with the embodiment.

While the invention was described with the first to third embodiments hereinbefore, the invention is not limited to the embodiments, and can be variously altered or modified.

For example, while the embodiments were described with a case that, for example, the lower magnetic film 11 and the upper magnetic film 14 previously had uniaxial anisotropy along a direction (such as the Y-axis direction) orthogonal to the direction of application of the fixed magnetic field H2, the application being corresponding to final magnetic field application, (for example, each film had a magnetization ease axis along the Y-axis direction), it is not always necessary that the films 11 and 14 previously have uniaxial anisotropy as in such a case. In the case that such previous application of the magnetic field (application of the fixed magnetic field H1) is not performed, when the fixed magnetic field H2 is applied, the magnetization direction of each of the lower magnetic film 11 and the upper magnetic film 14 is random, namely, unfixed. However, even in such a case, certain pinning effect can be obtained.

Moreover, in the embodiments, temperature in heat treatment in the magnetic field is desirably higher than a temperature that can provide an energy by which the anisotropic magnetization Ma and Mc of the first pair of divided areas can be displaced (rotated) in an application direction of a magnetic field, and is desirably a temperature at which the anisotropic magnetization Mb and Md can be pinned in the second pair of divided areas. If the heat treatment temperature is higher than the temperature at which the pinning can be performed, the anisotropic magnetization Mb and Md are also displaced (rotated) to the application direction of the magnetic field, and consequently advantages of the invention cannot be obtained.

While the embodiments were described with a case that the scratch-like grooves 16 and 17 are formed at the back sides of the lower magnetic film 11 and the upper magnetic film 14 (a substrate 10 side and an insulating film 12 side), the scratch-like grooves may be formed at surface sides of the lower magnetic film 11 and the upper magnetic film 14, and furthermore may be formed at both of the back sides and the surface sides. Even if the grooves are formed at the surface sides, the same advantage as that described in the embodiments can be obtained through the same pinning operation. When the grooves are formed at both sides, since the pinning operation is enhanced correspondingly, magnetic permeability in a high frequency range is further improved.

The description of the embodiments did not particularly refer to a formation pattern of the scratch-like grooves in the case that the scratch-like grooves 16 and 17 were discontinuously formed along an extending direction of a coil part. As the formation pattern of the scratch-like grooves 16 and 17 in such a case that the grooves are discontinuously formed, the following two patterns are considered: a formation pattern where the scratch-like grooves 16 and 17 are intermittently formed in lines along an extending direction of a coil part, and adjacent lines are arranged in a staggered manner to each other, and a formation pattern where the scratch-like grooves 16 and 17 are intermittently formed in lines along the extending direction, and adjacent lines are arranged in an opposed manner to each other (in an adjoining manner). Between the two formation patterns, the former formation pattern (a case that adjacent lines are arranged in a staggered manner to each other) is preferable. This is because decrease in volume of the lower magnetic film 11 or the upper magnetic film 14 can be relatively greatly reduced, consequently inductance of the thin film inductor can be further improved.

While the embodiments were described with a case that magnetic films are provided in both of the sides above and below the coil 13 (a case that both of the lower magnetic film 11 and the upper magnetic film 14 exist), the magnetic film can be formed in at least one of the sides above and below the coil 13. However, the magnetic films are preferably provided in both of the sides above and below the coil, since inductance of the thin film inductor is increased.

Figure 27:
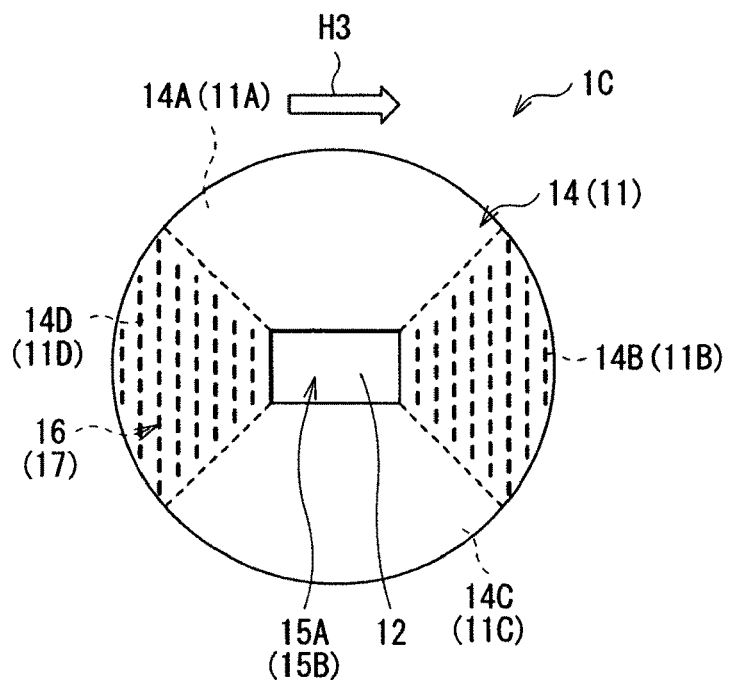
FIG. 27 is a plan diagram showing a configuration of a thin film magnetic device according to a modification of the invention.

While the embodiments were described with a case that the coil 13 was formed by a rectangular spiral coil having the first and second coil parts being approximately orthogonal to each other, a shape of the coil 13 being a thin film coil is not limited to this. For example, as the thin film inductor 1C as shown in FIG. 27, each of the lower magnetic film 11 and the upper magnetic film 14 may be in a circular shape (or in an elliptic shape). In addition, for example, the coil 13 may be also in a circular spiral shape. In this case, for example, it is enough that the scratch-like grooves 16 and 17 are formed on the lower magnetic film 11 and the upper magnetic film 14 along the Y-axis direction (X-axis direction) independently of a shape of the coil 13, and heat treatment is performed while applying a fixed magnetic field H3 along the X-axis direction (or Y-axis direction).

Figure 28:
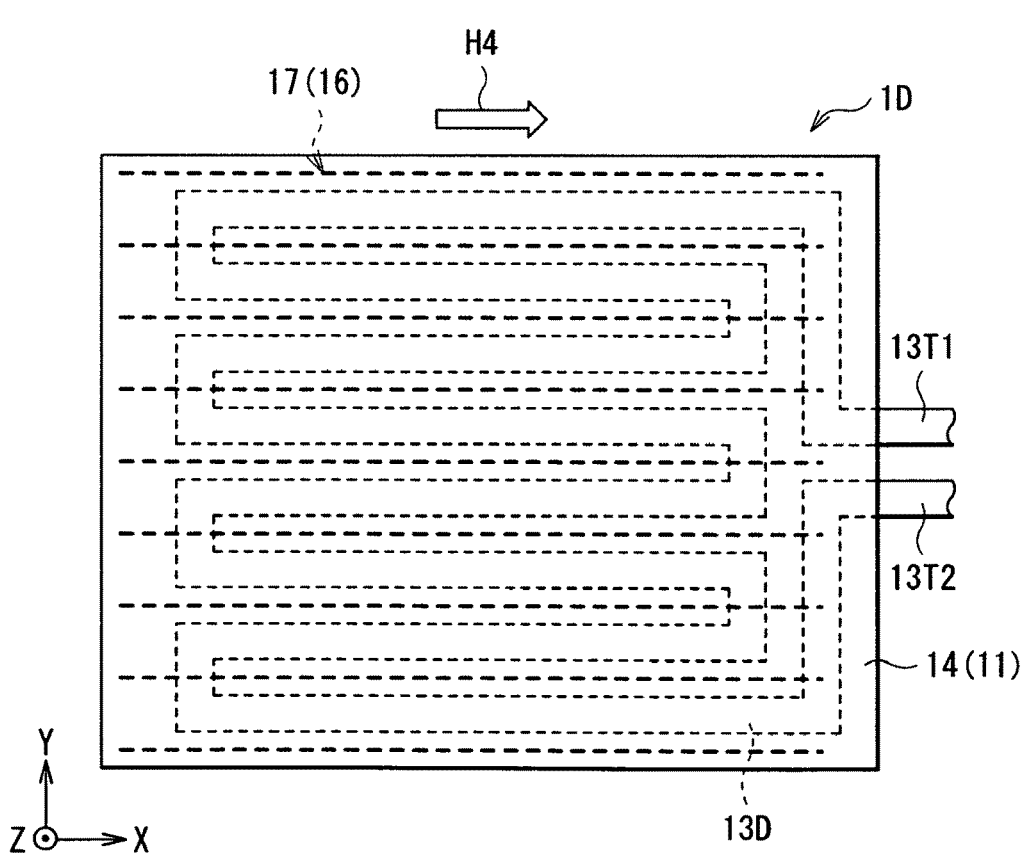
FIG. 28 is a plan diagram showing a configuration of a thin film magnetic device according to a modification of the invention.
Figure 29:
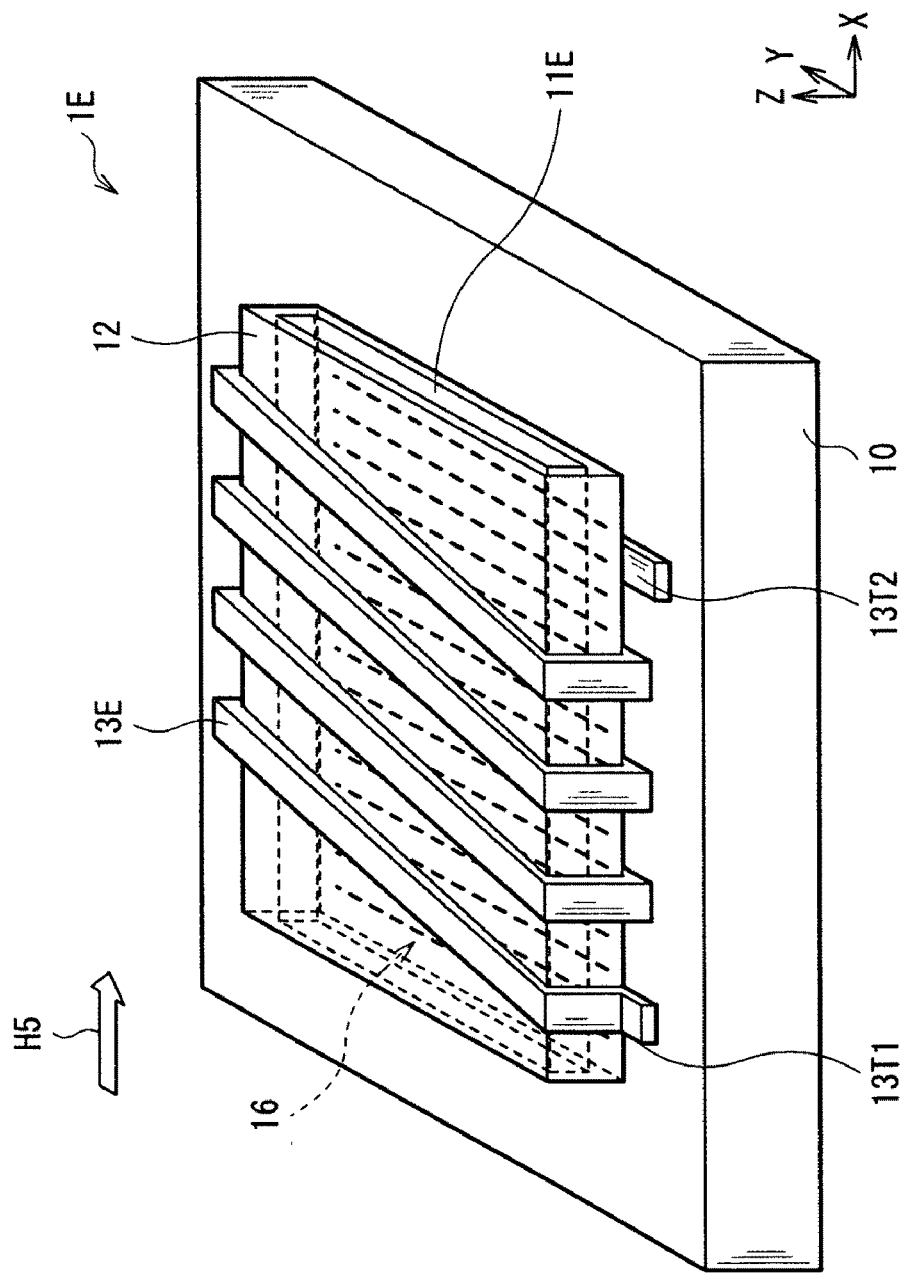
FIG. 29 is a perspective diagram showing a configuration of a thin film magnetic device according to a modification of the invention.
Figure 30A:
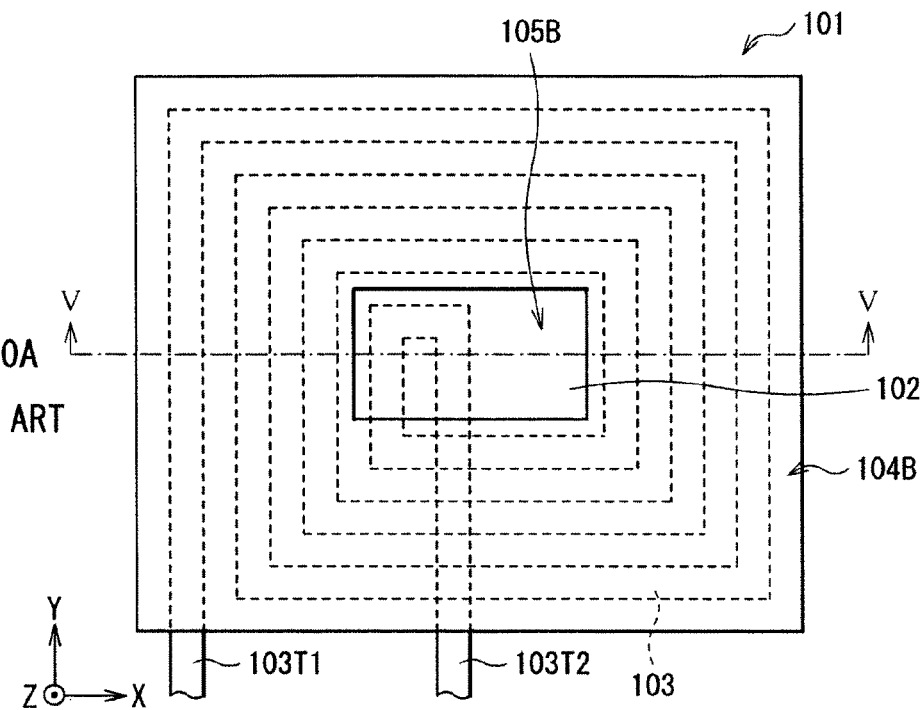
FIGS. 30A to 30B are a plan diagram and a cross section diagram showing a configuration of a thin film magnetic device of the related art, respectively.
Figure 30B:
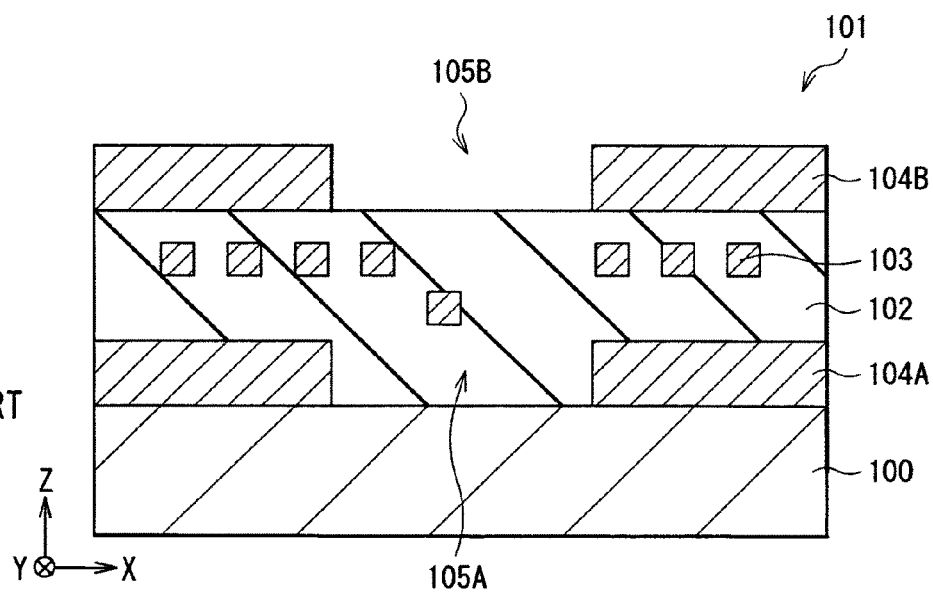

For example, the coil may be a rectangular meander coil 13D as a thin film inductor 1D as shown in FIG. 28. Moreover, for example, the coil may be a solenoid coil 13E as a thin film inductor 1E as shown in FIG. 29. Specifically, in the thin film inductor 1D as shown in FIG. 28, the scratch-like grooves 16 and 17 extending along the X-axis direction can be formed on the lower magnetic film 11 and the upper magnetic film 14 along a coil part along the X-axis direction of the coil 13D, and heat treatment can be performed while applying a fixed magnetic field H4 along the X-axis direction. In the thin film inductor 1E as shown in FIG. 29, the scratch-like grooves 16 extending along the Y-axis direction can be formed on the magnetic film 11E along a coil part, and heat treatment can be performed while applying a fixed magnetic field H5 along the X-axis direction.

While the above embodiments were described with the thin film inductors as an example of the thin film magnetic device, the invention can be applied to a thin film transformer and the like in addition to those. That is, the invention can be widely used for thin film magnetic devices without being limited to the thin film inductor as long as each of the devices has the magnetic film as described in the embodiments, and has predetermined electrodes.

Furthermore, the materials of the layers, film formation methods, and film formation conditions and the like described in the embodiments are not restrictive. Other materials, thickness, film formation methods, and film formation conditions may be used.

Obviously, many modification and variations of the present invention are possible in the light of the above teachings. It is therefore to be understood that within the scope of the appended claims the invention may be practices otherwise than as specifically described.

What is claimed is:

1. A thin film magnetic device comprising:
a thin film coil extending along a plane; and
one or more magnetic films disposed above or below or both of them of the thin film coil, and having anisotropic magnetization along a layer plane of the magnetic film, wherein
scratch-like grooves extending along an extending direction of the thin film coil are formed on a surface or a back or both of them of the magnetic film,
the scratch-like grooves are formed in a discontinuous manner,
the scratch-like grooves are intermittently formed in lines along a coil conductor part, and
an extending area of the thin film coil is divided into four divided areas along a winding direction of the thin film coil, the four divided areas consisting of:
a first pair of divided areas located along a crisscross line direction, the scratch-like grooves being not formed on the magnetic films in the first pair of divided areas, and
a second pair of divided areas located along another crisscross line direction, the scratch-like grooves being formed on the magnetic films in the second pair of divided areas,
the thin film magnetic device further comprising:
nonmagnetic films formed at underside of the magnetic films only in the first pair of divided areas.

2. A film magnetic device, comprising:
a thin film coil extending along a plane, and
one or more magnetic films disposed above or below or both of them of the thin film coil, and having anisotropic magnetization along a layer plane of the magnetic film, wherein
scratch-like grooves extending along an extending direction of the thin film coil are formed on a surface or a back or both of them of the magnetic film, and
an extending area of the thin film coil is divided into four divided areas by boundaries that are bended portions of a coil part of the thin film coil which is wound around so as to form a rectangular shape, the four divided areas consisting of
a first pair of divided areas located along a crisscross line direction, the scratch-like grooves being not formed on the magnetic films in the first pair of divided areas, and
a second pair of divided areas located along another crisscross line direction, the scratch-like grooves being formed on the magnetic films in the second pair of divided areas.

3. The film magnetic device according to claim 2, wherein the scratch-like grooves are formed in a discontinuous manner.

4. The film magnetic device according to claim 2, wherein:
a direction of the anisotropic magnetization of the magnetic films in the first pair of divided areas is orthogonal to an extending direction of the scratch-like grooves on the magnetic film in the second pair of divided areas.

5. The film magnetic device according to claim 4, wherein:
a direction of the anisotropic magnetization and the extending direction of the scratch-like grooves form an acute angle with respect to each other in the magnetic films in the second pair of divided areas.

6. The film magnetic device according to clam 2, further comprising:
dummy layers having scratch-like grooves formed thereon, and formed under the magnetic films only in the second pair of divided areas, the scratch-like trench corresponding to the scratch-like grooves on the magnetic films in the second pair of divided areas.

7. The film magnetic device according to claim 2, wherein adjacent lines are arranged in a staggered manner with respect to each other.

8. The film magnetic device according to claim 2, wherein a ratio of surface roughness of a surface with the scratch-like grooves of the magnetic film, to thickness of the magnetic film is 0.02 or more.

* * * * *